United States Patent [19]
Kitayoshi

[11] Patent Number: 5,656,932
[45] Date of Patent: Aug. 12, 1997

[54] NON-CONTACT TYPE WAVE SIGNAL OBSERVATION APPARATUS

[75] Inventor: Hitoshi Kitayoshi, Kamiayashi, Japan

[73] Assignee: Advantest Corporation, Tokyo, Japan

[21] Appl. No.: 371,885

[22] Filed: Jan. 12, 1995

[30] Foreign Application Priority Data

| Jan. 12, 1994 | [JP] | Japan | 6-001574 |
| Jan. 12, 1994 | [JP] | Japan | 6-001575 |
| Jan. 13, 1994 | [JP] | Japan | 6-001904 |
| Jan. 19, 1994 | [JP] | Japan | 6-004107 |
| Jan. 21, 1994 | [JP] | Japan | 6-005402 |

[51] Int. Cl.$^6$ ................................. G01R 27/28
[52] U.S. Cl. ................ 324/615; 324/630; 324/76.12
[58] Field of Search .................... 324/612, 615, 324/617, 618, 629, 630, 631, 637, 76.12, 76.19, 76.21, 76.24, 76.26, 76.78; 359/9

[56] References Cited

U.S. PATENT DOCUMENTS

| 4,247,815 | 1/1981 | Larsen et al. | 324/692 |
| 5,260,648 | 11/1993 | Brust | 324/76.26 X |
| 5,347,375 | 9/1994 | Saito et al. | 359/9 |

Primary Examiner—Kenneth A. Wieder
Assistant Examiner—Glenn W. Brown
Attorney, Agent, or Firm—Knobbe, Martens, Olson & Bear, LLP

[57] ABSTRACT

A non-contact type wave signal observation apparatus measures transfer functions of a distributed constant network. A signal is input from a network analyzer to the network to be measured. Electromagnetic waves radiated from the network are received at each observation point on an observation plane arranged in a manner facing the network. The received signals are input to the network analyzer. The transfer functions between an input terminal of the network and each observation point are measured by the network analyzer. The measured transfer functions are converted by an inverse-Fresnel transformer and are stored in memories. The stored data is specified by a control unit and is displayed on a display unit. The stored data can be converted by an inverse-Fourier transformer and is displayed on the display unit as waveforms. Further aspect of the apparatus is, by a non-contact method, to measure signals of a distributed constant network, to determine states of electromagnetic wave in the space, to decrease the amount of calculations in a hologram reconstruction process, and to display a complex three dimensional illustration for a holographic radar.

30 Claims, 17 Drawing Sheets

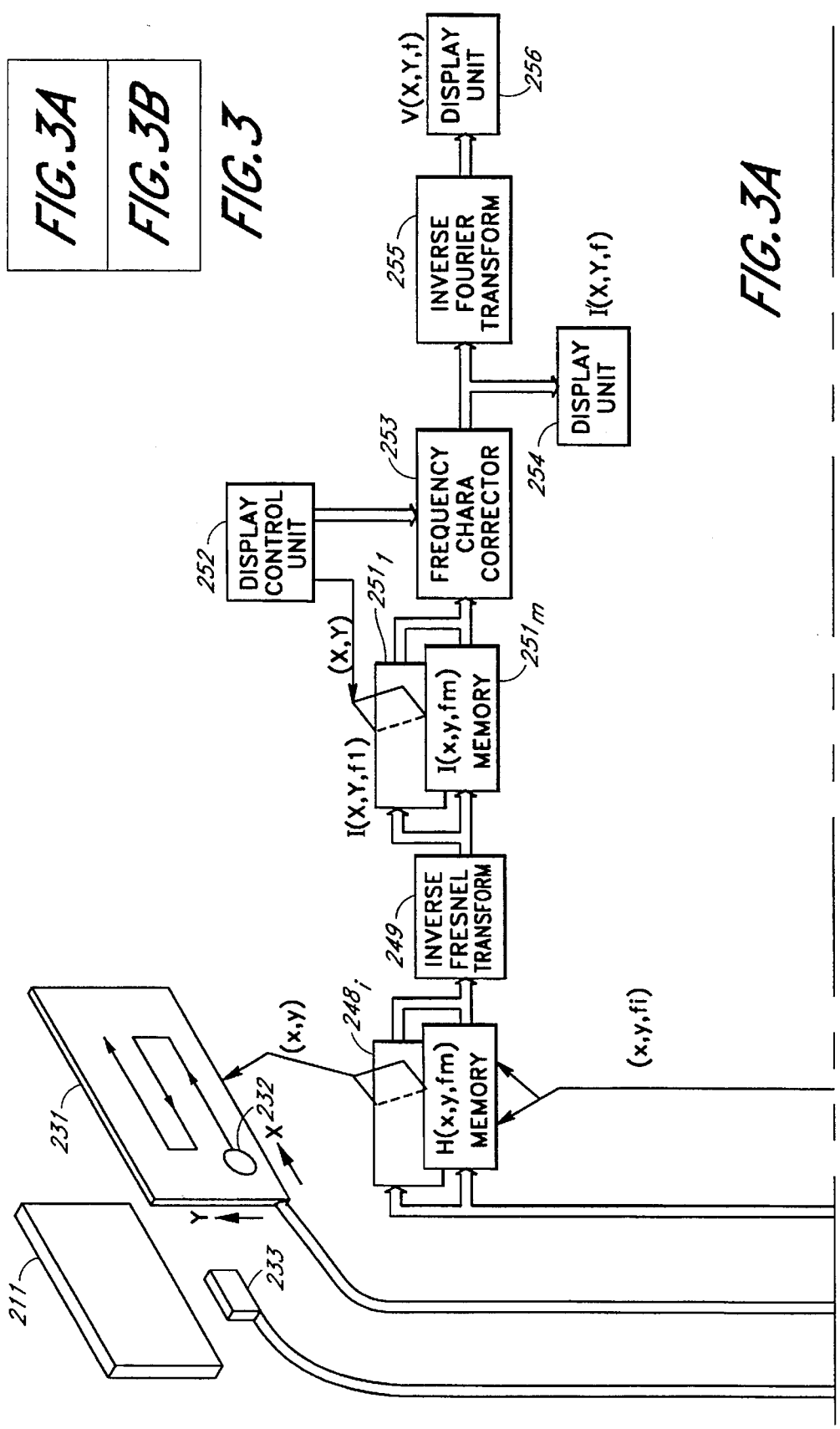

NON-CONTACT TYPE WAVE SIGNAL OBSERVATION APPARATUS

FILED OF THE INVENTION

This invention relates to a non-contact type wave signal observation apparatus. More precisely, this, invention relates to the following five apparatus. Throughout the specification, the same numerals in the parentheses will be used to designate the corresponding apparatus of the invention.

(1) The invention relates to an apparatus which measures transfer functions of a distributed constant network, which has no inner signal sources and is mainly used in a microwave and millimeter wave region, by a non-contact method. Such a distributed constant network is usually composed of passive elements, active elements, and distributed constant lines such as microstrip lines, slot lines, and coaxial cables.

(2) The invention relates to a signal observation apparatus which measures spectra and waveforms of signals in a distributed constant network, which has inner signal sources and is mainly used in the microwave and millimeter wave region, by a non-contact method.

(3) The invention relates to a spatial electromagnetic wave analysis apparatus which measures information of spatial polarized wave vectors such as intensity, axial ratios, axial directions, axial inclinations, and etc., of spatially polarized electromagnetic waves which propagate, or scatter, or exist in any fashion.

(4) The invention relates to a holographic radar. It radiates electromagnetic waves to an object in the space, receives interference waves in reflected waves at observation points on a hologram observation plane, performs hologram reconstruction calculations on the interference waves, and finally observes reflection object by the calculated results.

(5) The invention relates to a display apparatus which displays space propagation states of waves such as electromagnetic wave or sound waves and displays the results of holographic radars using the waves such as electromagnetic waves and sound waves.

BACKGROUND OF THE INVENTION (1) A conventional apparatus which measures transfer functions of distributed constant networks without having inner signal sources will be described in the following:

A prior art transfer function measurement apparatus is shown in FIG. 2. A distributed constant network 111 under observation is composed of a passive element 113 and an active element 114 connected on a substrate 112 with a distributed constant line 115 like a microstrip line. An input terminal 116 and an output terminal 117 which input and output signals are installed in the network 111. To measure the transfer function between the input terminal 116 and the output terminal 117, a test signal is input from a network analyzer 118 to the input terminal 116. The output signal from the output terminal 117 is input to the network analyzer whereby the transfer function is measured. For measuring a transfer function of a part of the circuit of the network 111, a test signal is input from the network analyzer 118 to the input terminal 116. A contact type probe 119 contacts the part of the network 111 to pick up a signal. The signal picked by the probe 119 is input to the network analyzer 118 and the transfer function is measured. When the location in the network 111 to measure a transfer function is known in advance, a power splitter 121 is connected at the location. The network 111 is so composed beforehand that a test terminal 122 is connected with the power splitter 121 and the signal is input and output through the test terminal 122. The test signal is measured between the test terminal 122 and the input terminal 116, or between the output terminal 117 and the test terminal 122, and the transfer function is measured.

In this arrangement of the prior art, the probe 119 influences the network 111 and thus a correct measurement cannot be available because the probe 119 directly contacts the network 111 as mentioned above in the measurement of a part of the network 111, although a correct measurement is available for the measurement between the input terminal 116 and the output terminal 117. Moreover, when the test terminal 122 is used, a relatively large loss of signal power is caused because the power splitter 121 always exists in the network 111. Moreover, unwanted couplings between the power splitter 121 and other circuit parts may be caused and thus, effective production of the networks which perform a correct operation is difficult.

(2) In the following, a conventional signal observation apparatus is described, which measures, by a non-contact method, spectrums and waveforms of the signal in a distributed constant network having inner signal sources.

Prior art signal observation apparatus is shown in FIG. 5. A distributed constant network 211 to be tested is provided with passive elements 213–215, and oscillation circuits 216–217 on a substrate 212. These elements are connected by distributed constant lines 218. An input terminal 219 and an output terminal 220 are also provided. A contact type probe 221 contacts the location that is to be measured in the distributed constant network under observation 211, and a signal picked at the location is input to a measurement unit such as an oscilloscope 222 and the signal waveform of the observation point is displayed. Alternatively, the signal of the output terminal 220 is input to the measurement unit such as an oscilloscope 222 thereby a signal waveform is measured.

If appropriate, a power splitter 223 is connected with the point of the network 211 that is to be measured as shown in FIG. 5 and a test terminal 224 is also installed in advance in the network 211. A signal is input through the test terminal 224 to the measurement unit such as an oscilloscope 222.

When signals at the location other than the input or output terminals are observed, the contact type probe 221 affects the performance of the network. Thus, accurate measurement of the characteristics of the network 211 is not available in the above-mentioned contact method because the contact probe 221 directly contacts the network 211.

Further, in case where the test terminal 224 is fixed to the network 111, there is a disadvantage that a power splitter for the test terminal 224 causes a relatively large signal loss in the network 211. Furthermore, unwanted couplings in the signals will be caused in the power splitter 223, and thus, the network 211 may not operate as expected. Moreover, when locations in the network 211 other than the test terminals need to be measured, the contact type probe as noted above must be used.

(3) In the following, a conventional spatial electromagnetic wave analysis apparatus is described, by which information on a spatially polarized wave vector of an electromagnetic wave is obtained.

Measurement of unwanted electromagnetic waves radiated from electronic devices, or a measurement of electromagnetic wave propagation environment such as compound scattering by a structure, or electromagnetic wave propagation in an ununiform medium, etc., are made as follows.

Intensity of one polarization in a specific direction was examined by a unidirectional, single polarized antenna of narrow beam such as a Yagi antenna, a helical antenna, or a horn antenna, etc., by rotating the antenna in a direction of the beam radiation as an axis, turning an azimuth angle of the antenna or an elevation angle of the antenna.

In this conventional technology, only linearly polarized electromagnetic waves can be received in the past by the Yagi antennas. Only circularly polarized electromagnetic waves can be received by the helical antennas. Thus, polarization information observed is limited by the antenna used. In the actual observation space, electromagnetic waves of various polarization modes exist. To know this information, electromagnetic waves such as horizontally polarized waves, vertically polarized waves, right-handed polarized waves, and left-handed polarized waves must be measured and the results must be analyzed totally. Moreover, a spatial distribution image is not easily obtainable in the conventional apparatus.

(4) A conventional holographic radar is described in the following, which radiates electromagnetic waves to the space, receives reflected waves from the space at each observation point on a hologram observation plane, performs hologram reconstruction calculations, and then observes the reflecting bodies.

A prior art holographic radar is shown in FIG. 11. High frequency signals such as microwave or millimeter waves are supplied to an antenna 412 for electromagnetic-wave emission by a network analyzer 411. The high frequency electromagnetic waves are continuously radiated to an observation space. Interference waves in the reflected waves from two or more places are received by a receiving antenna 414 at each observation point (x, y) on a hologram observation plane 413 which is set up opposite to the observation space. The received signal is input to the network analyzer 411.

Transfer functions H(x, y, f) of the route of electromagnetic waves from antenna 412 for the electromagnetic-wave emission to the observation point (x, y) are obtained by the network analyzer 411. The receiving antenna 414 is moved to each observation point (x, y) on the observation plane 413 and the reflected waves are received at each observation point (x, y). Alternatively, the receiving antennas 414 can be arranged at each observation point (x, y) on the observation plane 413 like an array. These antennas are switched one by one on the observation plane 413, a signal of each observation point (x, y) is received, and is input to the network analyzer 411. That is, the reflected wave at each observation point (x, y) on the observation plane 413 is received by the scanning-antenna receiving means.

The frequency f of the radiated electromagnetic wave is changed step by step and a space transfer function H(x, y, f) of each frequency f is measured as mentioned above. For the transfer function H(x, y, f) thus obtained, hologram reconstruction calculation shown by the next equation is performed by a hologram reconstruction calculation unit 415.

$$I(U, v, r) = \iiint H(x, y, f) \exp\{-j2\pi(ux - vy - fr)\}dxdydf \quad (1)$$

where u is an azimuth angle and v is an elevation angle when the observation space is seen from the observation plane 413, and r is a distance from the observation plane 413.

The hologram reconstruction result I(u, v, r) is supplied to a three-dimensional display unit 416 and is displayed in three dimensions. For instance, I(u, v, r) is displayed in two dimensions of u and v plane, at first, when r is fixed. Next, I(u, v, r) is displayed while r is varied, and so forth.

In this conventional holographic radar, there is a problem that it is necessary to perform the hologram reconstruction calculation according to the above-mentioned equation and thus needs an extremely large amount of calculation because the equations (1) requires a triple integration.

(5) A conventional display apparatus used for displaying space propagation of the wave or a holographic radar which uses such waves is described in the following.

A three-dimensional real number space shape can be expressed by a two-dimensional computer graphic, for example, by a method in which a distance is expressed by limiting brightness, that is, by shadowing.

In the conventional technology, a three-dimensional space complex number shape like an electromagnetic wave which has not only intensity information but also phase information, polarization information, and axial ratio information, etc., cannot be expressed on a two-dimensional surface.

SUMMARY OF THE INVENTION (1) According to the present invention, a transfer function of the distributed constant network is measured by a non-contact type transfer function measurement apparatus. A signal is input from a transfer function measurement means to a distributed constant network under observation. An electromagnetic wave is received at each observation point of an observation plane arranged to face the distributed constant network to be measured and the transfer function between an input terminal of the each observation point and the distributed constant network is measured first. The transfer function measured for each observation point is provided with the hologram reconstruction calculation by using an inverse-Fresnel transform process or a Fourier transformation process for each observation frequency. The result of the hologram reconstruction calculation for each point on the distributed constant network is displayed as a frequency response by specifying the point of the distributed constant network.

Weak electromagnetic waves are radiated from such networks of the microwave and millimeter wave. These electromagnetic waves are received and measured by the apparatus of the present invention. Based on the received signals on the observation plane, signals on the network to be observed are reconstructed through the hologram reconstruction calculation. An image of the distributed constant network under observation is displayed on the above mentioned display. Further, a two-dimensional display of the result of the hologram reconstruction calculation at each frequency and a display of frequency characteristic of a location specified in the two-dimensional display as a frequency response are also available. It is preferable that the image display and the two-dimensional display are shown in a superimposed fashion.

Compensations of gain and phase, etc., of the frequency response of the transfer function measurement system and the observation system are performed for the result of the hologram reconstruction. A time-domain response can be displayed by performing an inverse-Fourier transformation process to the displayed hologram reconstruction result.

(2) According to the present invention, an electromagnetic wave observation plane is provided for facing a distributed constant network under test and electromagnetic waves are received at each observation point of the observation plane and the resulted signals are output as voltages according to the non-contact type wave signal observation apparatus of the invention. Moreover, the signal is repeatedly taken out from the distributed constant network under observation, and a pulse signal synchronized with the repeated signal is generated. A voltage obtained at each observation point is converted to a complex voltage based on the phase of the pulse at each observation frequency and is stored in data memories. An inverse-Fresnel transform or a Fourier transform, that is, the hologram reconstruction calculation is performed for the complex voltage stored in the data memories and the result is stored in image memories. The data stored in the image memories are read out and displayed as spectrums or signal waveforms.

The data read out from the image memories may be compensated according to a radiation frequency characteristic of the observation point and a frequency characteristic of the observation, etc. before it is displayed. As for the conversion into the above-mentioned complex voltage, the observation frequency is selected from the voltage and the above-mentioned pulse signal of receiving the electromagnetic wave in the observation plane, respectively. The selected frequency component is converted to a signal of a low frequency. A discrete Fourier transform process is performed for the low frequency signal and the result of the discrete Fourier transform which corresponds to the receiving electromagnetic wave voltage is converted to a signal based on the phase of the above-mentioned pulse signal.

(3) According to the present invention, an electromagnetic wave is received at each observation point of the observation plane by a couple of antennas where an 8-figured beam pattern of the antennas are orthogonally arranged according to the spatial electromagnetic wave analysis apparatus of the invention. Each output signal received by the antenna pair is converted to a complex signal. Moreover, the reference signal to be used as a reference phase for the above-mentioned received electromagnetic wave is obtained and is converted to a reference complex signal.

The interference data of the orthogonal polarization component of the received electromagnetic wave is obtained by dividing each complex signal obtained at each observation point on the observation plane by this reference complex signal. The hologram reconstruction calculation for the observation plane is performed to each of the interference data. As a result, a polarized wave vector having a vertical component Ha(u, v) and a horizontal component Hb(u, v) of an elliptically polarized wave is obtained at each observation point (u, v). The polarized wave vector is displayed to show its intensity, an axial ratio, a direction of the radiation axis, and a parameter of the inclination etc. for each observation point.

(4) According to the holographic radar of the present invention, a radiated high frequency signal is modulated by a pulse signal. For the signal received by scanning-antenna receiving means, a quadrature detection is performed by the above-mentioned high frequency signal. The quadrature detection output is sampled in synchronism with the above-mentioned pulse signal. The hologram reconstruction calculation for the observation plane is performed on the sampled output. The timing of the sampling is shifted by a delay means, and the results of the hologram reconstruction calculation and the delay value are displayed in a three dimension manner.

Moreover, the radiated high frequency signal is modulated by the pulse signal according to the holographic radar of the invention. The signal received by the scanning-antenna receiving means is converted to a signal of lower frequency. The converted signal synchronizes with the above-mentioned pulse and is sampled by a sampling pulse having a frequency more than two times higher than the low frequency signal. The fixed number of sampled data is provided with a discrete Fourier transformation process. The hologram reconstruction calculation of the observation plane is performed for each result of the discrete Fourier transform of the fixed number of data. The calculation result and delay values are combined and displayed in the three dimensional form.

(5) In the present invention, a display apparatus for complex wave interference information is achieved as follows. Complex two-dimensional wave interference data is observed. For the observed wave interference data, the hologram reconstruction is carried out. The results of the hologram reconstruction calculation are converted from an orthogonal coordinate to a polar coordinate. Phase information on the converted data is further converted to hue information. The data converted to the hue information is modulated by the amplitude information converted to the coordinate as above, and the modulated data is displayed as a two-dimensional color image.

DESCRIPTION OF THE PREFERRED EMBODIMENTS (1) The first embodiment of the invention is explained with reference to the drawings.

Figure 1:
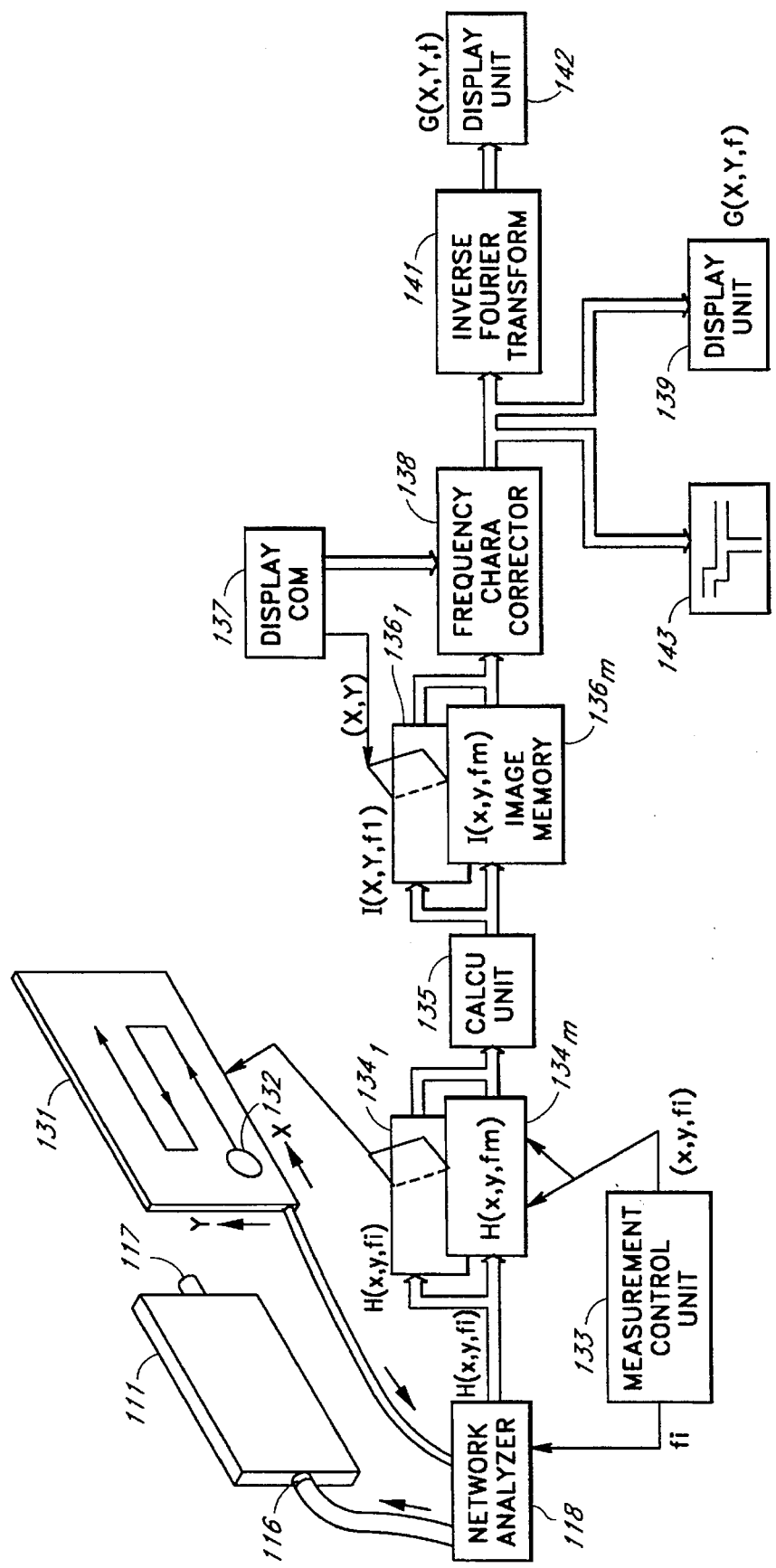
FIG. 1 is a block diagram showing an embodiment of a non-contact type transfer function measurement apparatus of the invention.
Figure 2:
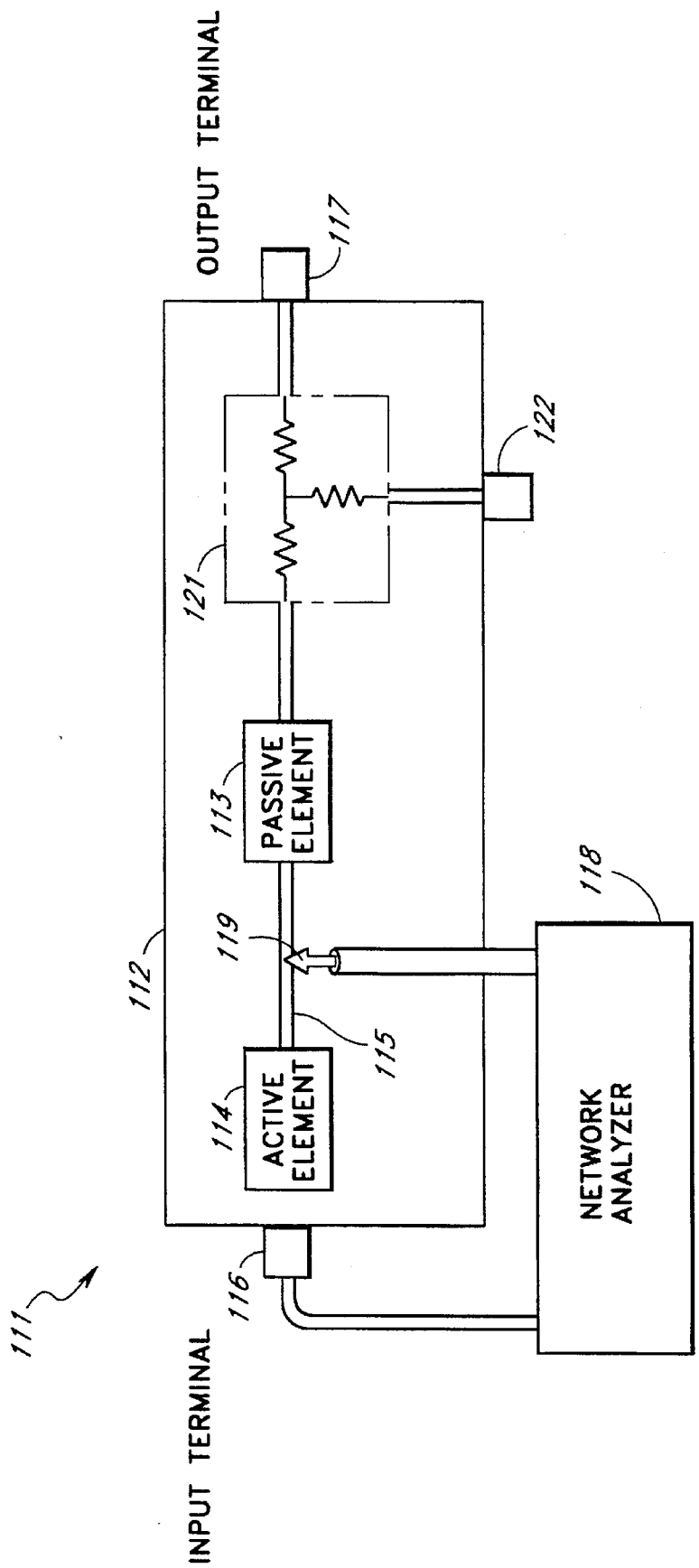
FIG. 2 is a block diagram showing a prior art transfer function measurement apparatus.

The embodiment of the non-contact type transfer function measurement apparatus of the invention is shown in FIG. 1.

First of all, a signal is input to a distributed constant network 111 under observation. Next, transfer function H(x, y, fi) between an input terminal and each observation point (x, y) on an observation plane 131 formed opposite to the network 111 is measured by a transfer function measurement means. For instance, the signal is input from a network analyzer 118 to an input terminal 116 of the network 111 to be measured. Moreover, a scanning-antenna receiving means is installed on the observation plane 131. An example of the scanning-antenna receiving means is shown in the following document, Dan Slater, "Near-Field Antenna Measurements", Artech House, 1991.

For instance, an antenna 132 is moved at each observation point (x, y) on the observation plane 131, and electromagnetic waves radiated from the network 111 are received by the antenna 132. The received signals are converted to voltage signals and input to a network analyzer 118. Thus, the transfer function H(x, y, fi) between the input terminal 116 and the observation point (x, y) of the network 111 is measured. The transfer functions of all the observation points on the observation plane 131 are measured in this manner. Alternatively, as another scanning-antenna receiving means, outputs of an array antenna can be input to the network analyzer 118 one by one by arranging each antenna 132 at each observation point (x, y) on the observation plane 131. The position of the observation point (x, y) on the observation plane 131 and the frequency of the signal supplied to the network 111 are controlled by a measurement control unit 133.

Transfer functions H(x, y, fi)–H(x, y, fm) obtained for each observation frequency fi–fm are stored in data memories $134_1$–$134m$ respectively in the addresses defined by the measurement control unit 133. These transfer functions H(x, y, fl)–H(x, y, fm) are taken out from the data memories $134_1$–$134m$ at each observation frequency fi(i=1,2, ..., m). Hologram reconstruction calculation is performed by using this data by a hologram construction calculation unit 135. As a result, a two-dimensional received data for the observation plane 131 is converted to the corresponding position on the network 111. That is, the point on the network to obtain the transfer function by performing the hologram reconstruction is attained by using the interference of the electromagnetic wave radiated from the network 111 on the observation plane 131 by the space propagation.

Let L be a distance between the network 111 and the observation plane 131. When $L<D^2/\lambda i$, transfer functions I(X, Y, fi) are obtained by performing the inverse-Fresnel transformation to the transfer functions H(x, y, fi) by the following equation.

$$I(X, Y, fi) = K \iint H(\xi,\eta,fi) \exp\{j\pi/\lambda iL((\xi-x)^2+(\eta-y)^2)\} d\xi d\eta \quad (2),$$

where $K=-j\lambda iL\exp(j2\pi L/\lambda i)$, $\lambda i=C/fi$, C is the speed of light, D is a size of the observation plane 131 and $\lambda i$ is an observation wave length.

Actually, the Fourier transform (here shown by F) and the inverse-Fourier transform (here shown by $F^{-1}$) are used according to the following equations.

$$I(X, Y, fi) = F^{-1}[F[H(x,y,fi)]F[P(x,y,fi)]] \quad (3),$$

where $P(x, y, fi) = \exp(-j\pi(x^2+y^2)/\lambda iL)$.

When $L>D^2/\lambda i$, transfer functions I(u, v, fi) is obtained by performing the Fourier transform to the transfer functions H(x, y, fi) by the following equation.

$$I(u, v, fi) = \iint H(x, y, fi)\exp\{-j2\pi(ux+vy)\} dxdy \quad (4),$$

where v is an azimuth angle and u is an elevation angle. As a result of the foregoing hologram reconstruction, the inverse-Fresnel transform, (X, Y, fi)–I(X, Y, fm) are stored in the image memories $136_1$–$136_m$. The reconstructed output point (X, Y) on the network 111 can be specified by a display control unit 137. The data I(X, Y, fl)–I(X, Y, fm) of the specified point is read from the image memories $136_1$–$136_m$ and are supplied to a frequency characteristic corrector 138. Moreover, the radiation frequency characteristic at a position on the network 111 which corresponds to the specified position (x, y), that is, the compensating characteristics which correspond to the frequency characteristic of a leakage electromagnetic wave at the position of the network is supplied from the display control unit 137 to a frequency characteristic corrector 138.

Such a frequency characteristics of the leakage electromagnetic wave is determined by, for instance, the width and the thickness etc. of the microstrip line. In the frequency characteristic corrector 138, compensating factors corresponding to the frequency characteristic of the observation system which contains the antenna 132 and the compensating conditions supplied from the display control unit 137 are multiplied by the input data (I(X, Y, fl)–I(X, Y, fm). The compensated data I'(X, Y, fl)–I'(X, Y, fm) are displayed on the display unit 139 as a frequency response.

Moreover, the inverse-Fourier transform is performed by an inverse-Fourier transform unit 141 and the output of the frequency characteristic corrector 138 is displayed on a display unit 142 as a signal waveform. A physical image of the network 111 under test is displayed on a display unit 143. The reconstructed output point on the network 111 for which the transfer function is to be displayed can be specified through the display control unit 137 by identifying the point with a cursor for instance.

Any data I(X, Y, fi) in the image memories $136^1$–$136_m$, which is either compensated by the frequency characteristic corrector 138 or not compensated, may be displayed on the display unit 143 in parallel with the image of the network 111 or superimposed on the image of the network 111. The data for the image of the network 111 may be made from a written image on a sheet of paper taken by a video camera. Further, the image data may be produced through a computer graphic. The image data may also be obtained from the CAD system which has been used for designing the network 111 and stored in memories of the display unit 143.

Moreover, the image of the network 111 may be drawn on a transparent form, and two-dimensional display of above-mentioned data I(X, Y, fi) may be superimposed on the transparent image.

When the position where the transfer function is to be measured is known in advance, the hologram reconstruction calculation may performed only for the reconstructed output point (X, Y) or (u, v). That is, the hologram reconstruction calculation of all points of the network 111 need not be performed. If the frequency characteristic of the observation system and the radiation frequency characteristic of the network 111 are comparatively flat within the range of the observation frequency, the frequency characteristic corrector 138 can be omitted. Moreover, the display units 139, 142, 143 may be unified to be only one display unit, and the display unit may display the measured data in parallel or in a switched-display fashion.

In the present invention as described above, there are following advantages. First of all, the transfer function between each observation point on the observation plane 131 separated from the network 111 and the input terminal of the network 111 is obtained. The hologram reconstruction calculation is used and the measurement results on this observation plane 131 can be replaced with the measurement results in the reconstructed output point on the network 111. Therefore, the measurement of the transfer function between the input terminal of the network 111 and each reconstructed output point can be accomplished by a non-contact manner and thus accurate measurement results are obtained. Moreover, there is no signal loss by a power splitter because such a test terminal is not installed in the network to be measured. Moreover, because unwanted couplings will not occur, manufacturing the network 111 becomes easy. The results of the hologram reconstruction calculation are displayed in two dimensions. Moreover, the physical image of the network 111 is displayed. An abnormal location can be known because of the display of the measurement results. Therefore, the transfer function of the location can be easily known by specifying the position on the displayed physical image.

Moreover, the location where an abnormal radiation caused by soldering, for example, is known at once because of the two-dimensional display and the transfer function of the location can be known.

The transfer functions can be correctly measured without being affected by the radiation characteristic of the network 111 or the frequency characteristic of the observation system by utilizing the frequency characteristic corrector 138. When the network 111 is built in a comparatively large equipment, the transfer functions can be similarly measured in a non-contact manner by using the Fourier transform for the hologram reconstruction calculation.

(2) The second embodiment of the invention is explained with reference to the drawings.

Figure 3B:
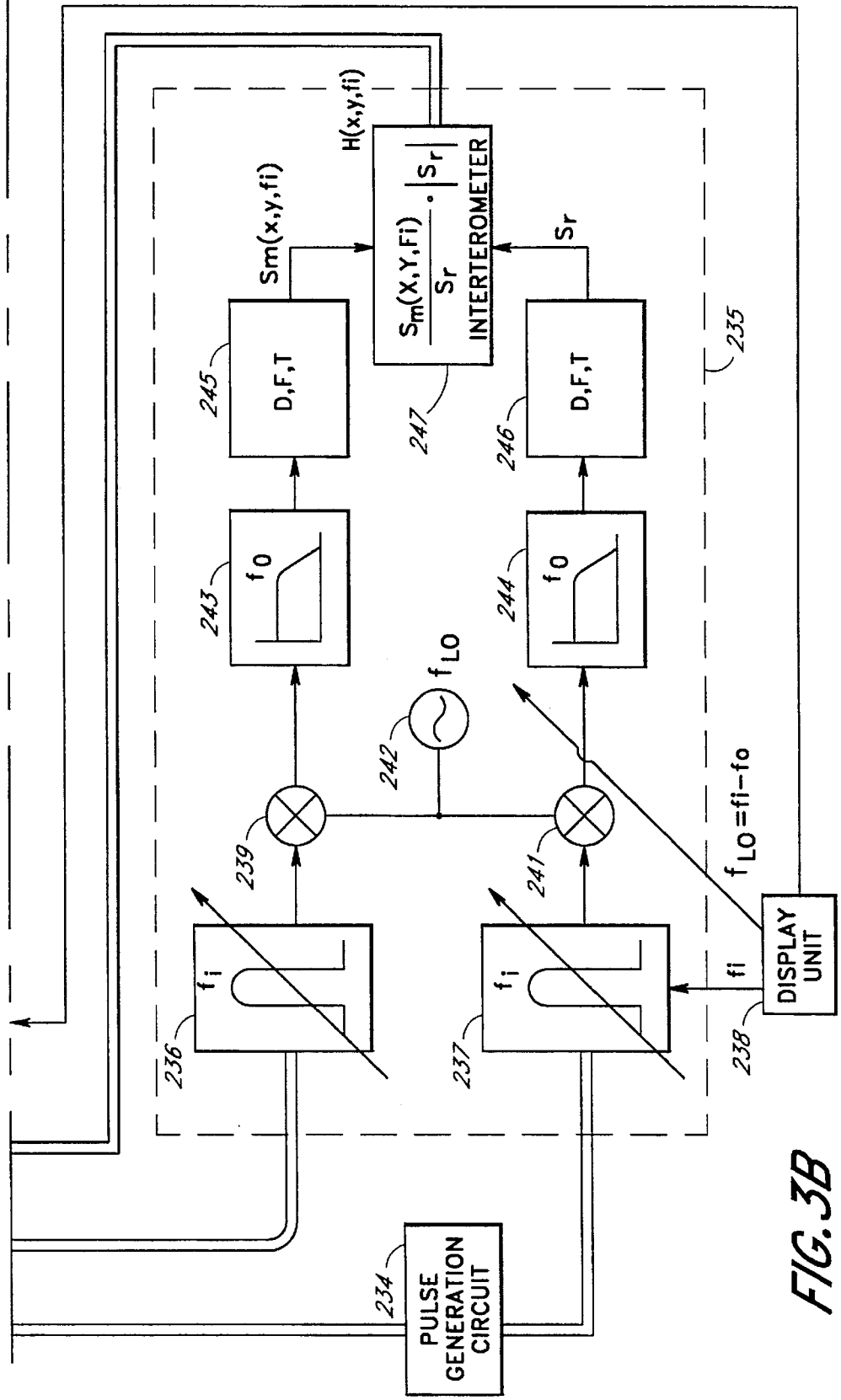
FIG. 3 is a block diagram showing an embodiment of a non-contact type wave signal observation apparatus of the invention.

The embodiment of the non-contact type wave signal observation apparatus of the invention is shown in FIG. 3. An electromagnetic wave observation plane 231 is provided in a manner facing a distributed constant network 211 under observation. A scanning-antenna receiving means for receiving an electromagnetic wave of each observation point on the electromagnetic wave observation plane 231 and transmitting the wave as voltage signals is installed. For instance, the example of scanning-antenna receiving means is shown in the following document, Dan Slater, "Near-Field Antenna Measurements", Artech House, 1991.

That is, an antenna 232 such as a monopole antenna or a loop antennas is moved to each observation point of the observation plane 231 defined by the orthogonal coordinate (x, y) and the received voltage signal is output therefrom. Alternatively, two or more antennas 232 are aligned for each observation point of the observation plane 231 respectively, as an array antenna. Any element of the array antenna is selected, and the received voltage is output therefrom. With a couple of dipole antennas or a couple of loop antennas, etc. which are arranged orthogonally with each other may be used to examine polarization modes of the received electromagnetic wave. The observation plane 231 is brought close to the network 211 in the ranges which do not cause any unwanted couplings with the network 211 which faces the observation plane 231.

A repetition signal is taken out from the distributed constant network 211 under observation. To do this, an antenna 233 for a reference timing is installed in FIG. 3. The output of the antenna 233 is supplied to a pulse generation circuit 234. The pulse signal is generated which is synchronized with the operation cycle of the repetition signal received by the antenna 233, that is, the signal generated by the network 211 (waveform cycle). Preferably, this pulse signal should be as sharp as possible, so as to include sufficient spectrum density within the range of the frequency to be observed, and the phases in the spectrums should be coherent. Electromagnetic waves ordinarily leak, even though a small amount, from various parts of the distributed constant network 211. This electromagnetic wave is received by the antennas 232 and 233.

The voltage which corresponds to an electromagnetic wave of each observation point on the observation plane 231 received by the antenna 232 is converted to the complex voltage based on the phase of the pulse signal from the pulse generation circuit 234 by a complex voltage conversion unit 235 in each observation frequency. That is, the same observation frequency defined by variable band pass filters 236 and 237 is selected from the received signal from the antenna 232 and the output pulse signal of the pulse generation circuit 234. A pass band frequency fi of the band pass filters 236 and 237 is set by a control unit 238 and position (x, y) on the observation plane 211 for the antenna 232 to receive the output is specified. The selected frequency components are mixed with a frequency fL from an oscillator 242 at frequency mixers 239 and 241, respectively, and the outputs of the frequency mixers are provided to low pass filters 243 and 244 having a cut off frequency of f0(=fi-fLO). The filtered frequency components from the low pass filters 236 and 237 become signals of a fixed low frequency.

The outputs of the low pass filters 243 and 244 are provided with a discrete Fourier transform process at the frequency f0 by discrete Fourier transform units 245 and 246, respectively. An interference operation is carried out by an interferometer 247 for complex spectrums Sm(X, Y, fi) and Sr converted by the discrete Fourier transform units 245 and 246. Therefore, the next equation is carried out by the Discrete Fourier transform units 245 and 246.

$$H(x, y, fi) = \{Sm(X, Y, fi)/Sr\} \cdot |Sr|$$

The discrete Fourier transform output Sm(X, Y, fi) which corresponds to the received signal for each observation point (x, y) is converted to a signal H(x, y, fi) based on the phase of the discrete Fourier transform output Sr which corresponds to the pulse signal. Thus, normalized observation data H(x, y, fi) for each observation point (x, y) of the observation plane 231 at the specified observation frequency fi is obtained and stored in a data memory 248i. In the same way, the observation frequency fi is changed from $f_1$ to $f_m$ and the corresponding standardized observation data H(x,y, fi)–H(x, y, fm) is obtained accordingly and are stored in data memories $248_1$–$248_m$, respectively. When the receiving position (x, y) in the observation plane 231 is specified by the control unit 238, the standardized observation data H(x, y, fi) in the memory address of the data memories $248_1$–$248_m$ is specified.

The stored data in the data memories $248_1$–$248_m$ is taken out for each observation frequency fi and is proceeded through an inverse-Fresnel transform process to a distance L and a wave length λi, respectively, by an inverse-Fresnel transform unit 249. That is, the calculation based on the above equations (2) and (3) are carried out.

In the foregoing, L is a distance between the network 211 under test and the observation plane 231, c is the speed of light, η is a variable range of x, and ξ is a variable range of y.

The standardized observation data I(X,Y, fl)–I(X, Y, fm) to which the inverse-Fresnel transform has been performed is stored in image memories $251_1$–$251_m$, respectively. A two dimensional image of the electromagnetic wave observed by the observation plane 231 is converted by the inverse-Fresnel transform in the foregoing to a state that would be observed at the position on the space of the distributed constant network 211 under observations. That is, the electromagnetic waves radiated from the network 211 are interfered with the space propagation and observed on the observation plane 231. The hologram reconstruction is performed for the interference electromagnetic waves, which enables to extract the point of the network 211 to be observed.

The position (X, Y) on the network 211 under observation is specified by a display control unit 252, and the inverse-Fresnel transform data I(X,Y, fl)–I(X, Y, fm) at the position (X,Y) are read from the image memories $251_1$–$251_m$, respectively, and are supplied to a frequency characteristic corrector 253. Moreover, the compensating characteristics which correspond to the frequency characteristic of a leakage electromagnetic wave to which the radiation frequency characteristic at a position on the network 211 which corresponds to this specified position (X,Y) are supplied from the display control unit 252 to the frequency characteristic corrector 253. Such radiation frequency characteristics are determined, for example, by the width and thickness of micro strip lines at the specific position on the network. The inverse-Fresnel transform may be obtained by specifying the measurement point (X,Y) on the network 211 in advance. In such a case, the standardized observation data is also required for all the positions on the observation plane for each observation frequency.

The distance L between the network 211 and the observation plane 231 should be small because the electromagnetic wave radiated from the network 211 is usually very small. However, when a network 211 in a comparatively large equipment is measured, it is likely to become the distance $L > D^2/\lambda i$ (where D is a size of the network 211 under observation) when the distance L is comparatively large. In such a case, the Fourier transform for the wave length is performed instead of the inverse-Fresnel transform. That is, the calculation of above-mentioned expression (4) is performed.

Figure 4:
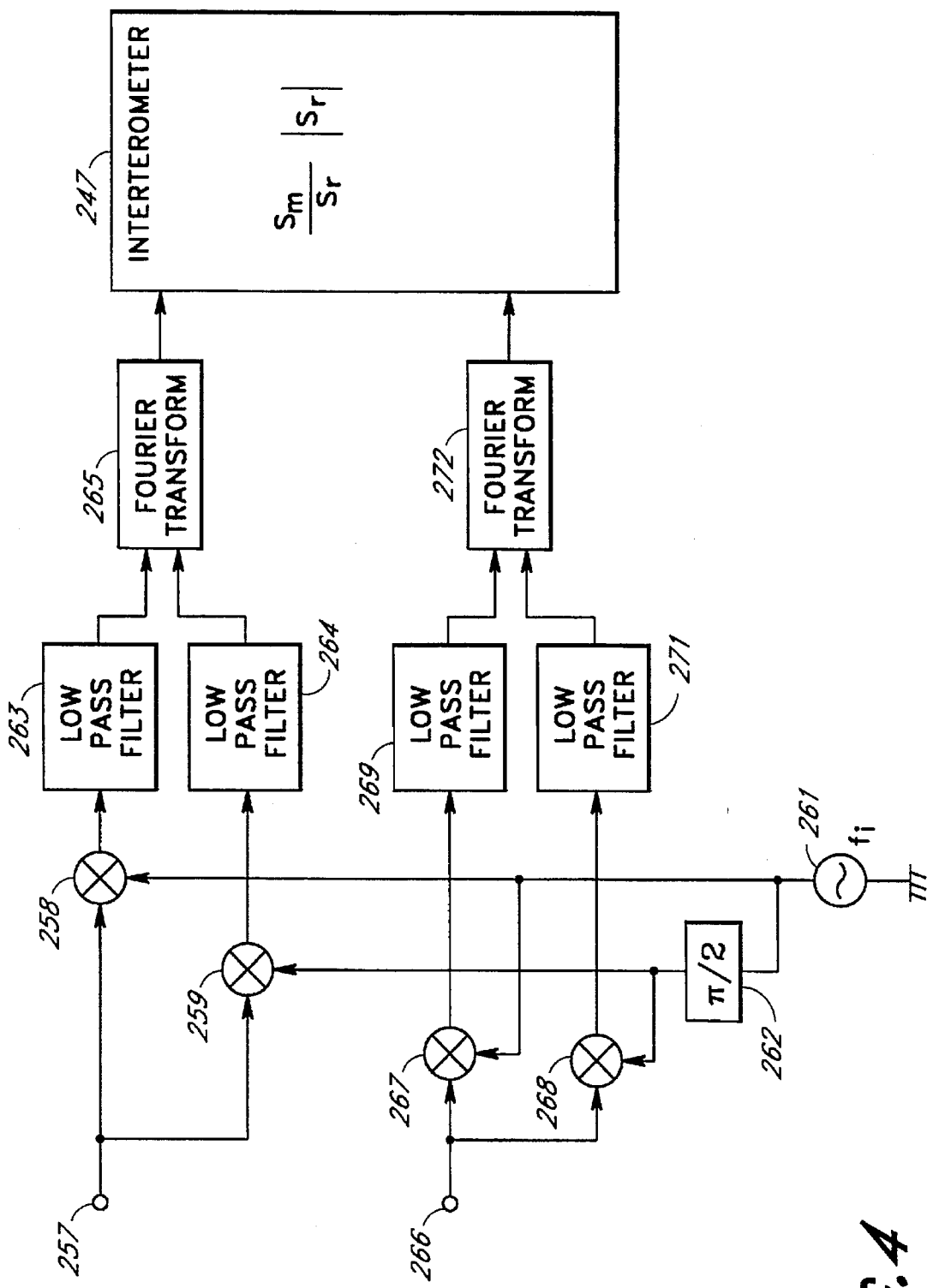
FIG. 4 is a block diagram showing another example to obtain the standardized complex observation data.
Figure 5:
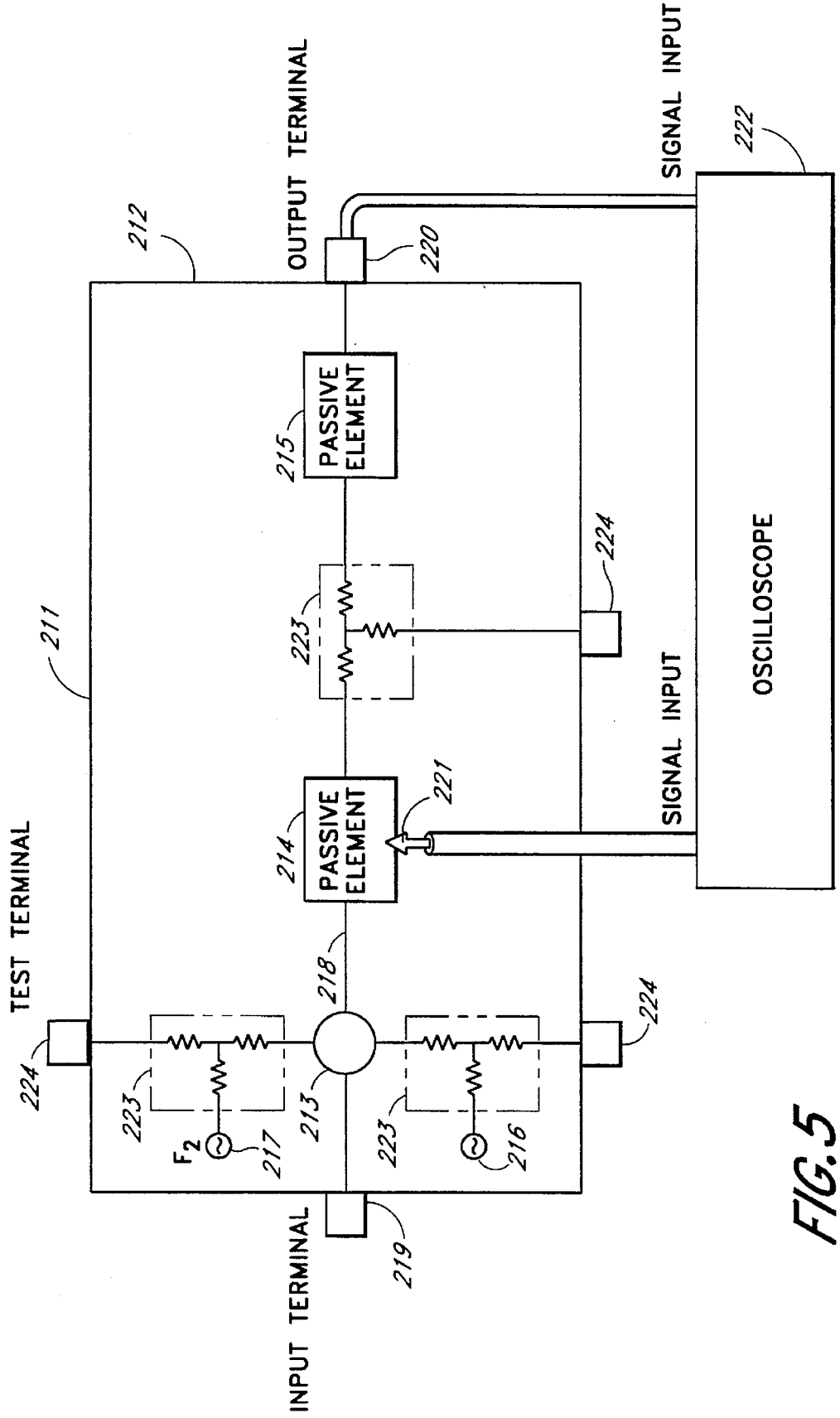
FIG. 5 is a block diagram showing a prior art signal observation apparatus.

To obtain the standardized observation data H(x, y, fi), it is possible to proceed as shown in FIG. 4. That is, the received signal from the antenna 232 is supplied to multiplication units 258 and 259 through a terminal 257 whereby multiplied by a frequency signal fi from a local oscillator 261 and a frequency signal fi from the local oscillator 261 which is $\pi/2$ shifted by a phase shifter 262, respectively. A signal Sm(X, Y, fi) is obtained by performing a complex Fourier transform function for the outputs of the multiplication units 258 and 259 each of which is supplied to a complex Fourier transform unit 265 through low pass filters 263 and 264 having a cutoff frequency of fo.

Similarly, the pulse signal from the pulse generation circuit 234 is supplied from a terminal 266 to multiplication units 267 and 268 and multiplied by the frequency signal fi from the local oscillator 261 and the frequency signal fi which is $\pi/2$ shifted by he phase shifter 262. The signal Sr is obtained by performing a complex Fourier transform function for the outputs of the multiplication unit 267 and 268 each of which is supplied to a complex Fourier transform 5 unit 272 through low pass filters 269 and 271 having a cutoff frequency of fo. The signals Sm(X, Y, fi) and Sr are supplied to an interferometer 247 whereby processed as described with reference to FIG. 3. The oscillation frequency fi of the local oscillator 261 is changed to set a frequency range (fi–f0–fi+f0) of the observation frequency.

In the foregoing, the frequency characteristic corrector 253 can be omitted when the above-mentioned radiation frequency characteristic and the frequency characteristic of the observation system are comparatively flat within the range of the observation frequency. Moreover, when the phases are almost completely coherent by the same amplitude within the range of the observation frequency, the spectrum of the pulse signal from the pulse generation circuit 234, the multiplication of |Sr| by the interferometer 247 can be obviated. In addition, when an array antenna having many antenna elements aligned therein is used as the antenna 232, one of the antenna element may be used as the reference timing antenna 233. Moreover, the antenna 233 for the reference timing can be omitted, and the signal is taken out from the network 211 directly, and is input to the pulse generation circuit 234. Although the observation data H(x, y, fi) of each observation frequency fi at each observation point of the observation plane 231 is obtained in the foregoing, it is also possible to obtain H(x, y, fi) for the frequencies $f_1$–$f_m$ at each point (x, y) of the observation plane 231 while shifting the point (x, y) one by one on the observation plane 231.

According to the invention described above there are following advantages. The radiated weak electromagnetic wave from the distributed constant network 211 is received at each observation point on the observation plane. The repetition signal of the network 211 is used as a reference to form the complex signal of the received signal. The received signal is converted to the two-dimensional signal of the network 211 under observation by operating the hologram reconstruction. Therefore, the spectrums and the waveforms of the signal in the desired measurement point can be correctly measured without influencing the network 211 under observation. Moreover, the signal loss is not caused to the network 211 under observation.

Moreover, the location where an abnormal radiation is caused, for instance by the soldering, can be known at once. If frequency characteristic corrector 253 is used, the signal of the observation point can be measured without undertaking the influence of the radiation characteristic of the network 211 and the frequency characteristic of the observation system.

(3) The third embodiment of the invention is explained with reference to the drawings.

Figure 6:
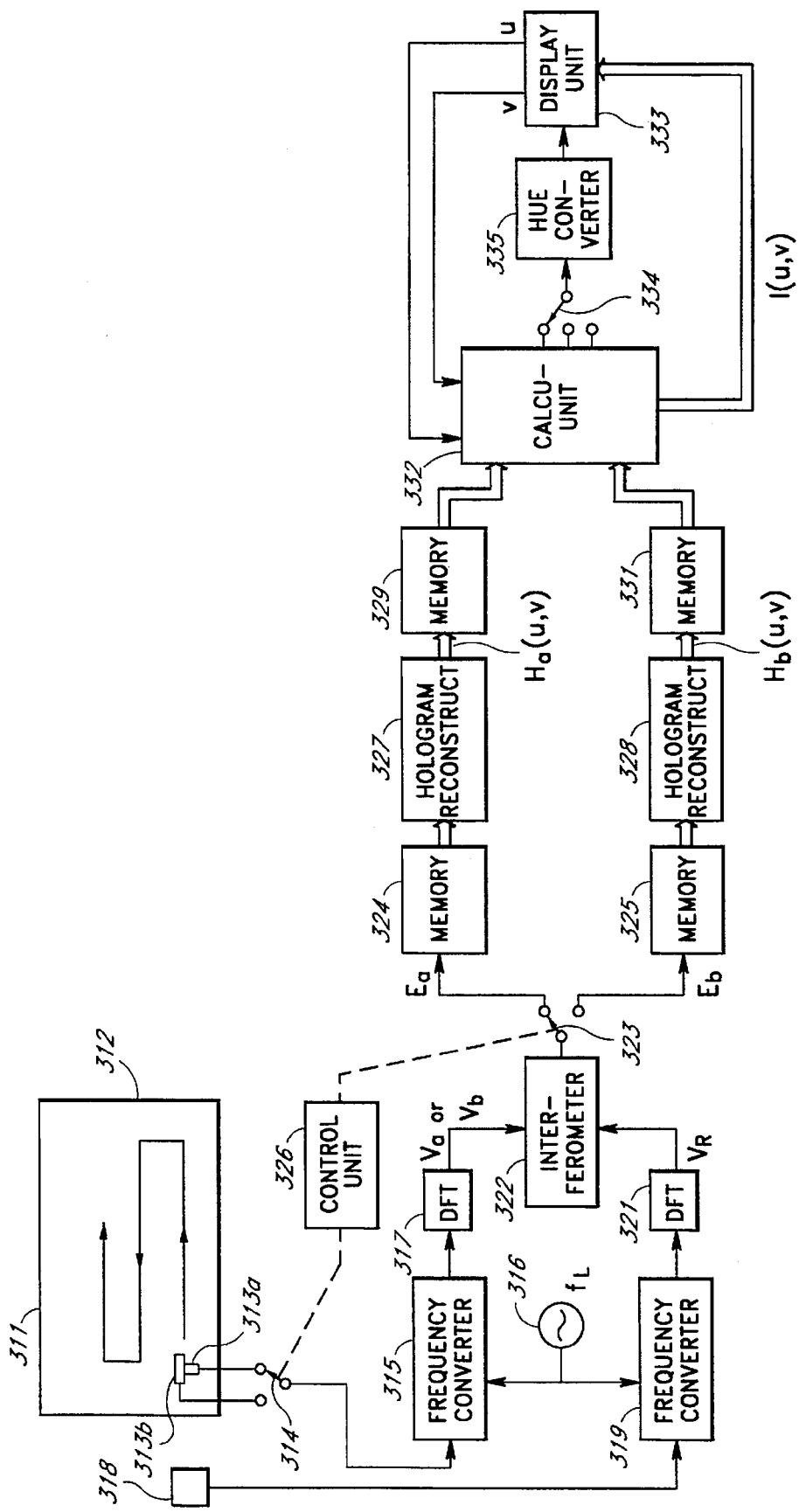
FIG. 6 is a block diagram showing an embodiment of a spatial electromagnetic wave analysis apparatus of the invention.

The embodiment of the spatial electromagnetic wave analysis apparatus of the invention is shown in FIG. 6. An electromagnetic wave is received by a scanning-antenna receiving means 312 at each observation point (x, y) of an electromagnetic wave observation plane 311. An example of such a scanning-antenna receiving means 312 is shown in the above noted document "Near-Field Antenna Measurements".

Unlike the antenna which receives only one polarization mode, the present invention utilizes an antenna pair 313a and 313b with an 8-figured beam pattern such as dipole antennas or loop antennas, etc. by arranging the 8-figured beam patterns mutually orthogonal. Each antenna pair is moved to each observation point (x, y) on an electromagnetic wave observation plane 311 and receives a signal of the observation point. Alternatively, such pairs of antennas 313a and 313b are arranged at each observation point (x, y) on the electromagnetic wave observation plane 311 and are switched one by one to receive the corresponding signal.

The received signal from the scanning-antenna receiving means 312 is converted to a complex signal for each pair of antennas 313a and 313b. For instance, the signals received by the antennas 313a and 313b are switched by a switch 314 and are supplied to a frequency converter 315. The frequency converter 315 converts the received signal to an IF (intermediate frequency) signal using a local signal of frequency fL from a local oscillator 316. The converted IF signal is provided with a discrete Fourier transform process by a discrete Fourier transform unit 317. Complex signals Va(x, y) and Vb(x, y) which corresponded to the antennas 313a and 313b are obtained as the conversion results at each observation point (x, y) on the electromagnetic wave observation plane 311.

Further, a reference signal which is used as a reference phase for the received signal from the antenna 313a and 313b is produced by a fixed antenna 318. This reference signal is also converted to a complex signal. That is, the output of the fixed antenna 318 is converted to an IF signal by the local signal from the local oscillator 316 by the frequency converter 319. The discrete Fourier transform is performed by a discrete Fourier transform unit 321 for this IF signal, and a reference complex signal VR of the reference signal is obtained as a result.

The complex signals Va(x, y) and Vb(x, y) of each observation point are divided by the reference complex signal VR by an interferometer 322, which results interference data Ea(x, y) an Eb(x, y), respectively. These interference data Ea(x, y) and Eb(x, y) are switched by a switch 323 and are stored in interference data memories 324 and 325. In that case, information which shows the observation point (x, y) received by a control unit 326 is also stored in the memories 324 and 325 as address data. Moreover, the control unit 326 controls the operation of the switches 314 and 323.

For the interference data Ea(x, y) and Eb(x, y), hologram reconstruction calculations for the electromagnetic wave observation plane 311 are respectively performed by the equation in the following by hologram reconstruction units 327 and 328.

$$Ha(u, v)=\iint Ea(x, y)\exp\{-j2\pi(ux+vy)\}dxdy$$

$$Hb(u, v)=\iint Eb(x, y)\exp\{-j2\pi(ux+vy)\}dxdy$$

where u is an azimuth angle and v is an elevation angle, respectively, by which the observation point is seen from the electromagnetic wave observation plane 311.

The results Ha(u, v) and Hb(u, v) of the hologram reconstruction calculations are stored in holographic memories 329 and 331, respectively. A polarized wave vector Hab(u, v, φ) in which the hologram reconstruction results Ha(u, v) and Hb(u, v) are assumed to be a vertical component and the horizontal component, respectively, of the elliptically polarized electromagnetic wave is calculated about each observation point (u, v) by a polarization calculation unit 332 based on the following equation.

$$Hab(u, v, \phi)=Ha(u, v)\cos\phi+Hb(u, v)\sin\phi.$$

That is, the polarized wave vector Hab has only a horizontal component Hb(u, v) when φ=π/2, and has only a vertical component Ha(u, v) when φ=0. An angle φMA by which the absolute value of the polarized wave vector Hab becomes the maximum and an angle φM1 by which the polarized wave vector Hab becomes the minimum are obtained about each observation point (u, v). At this time, |Hab(u, v,|MA)φ is a major axis of the elliptically polarized electromagnetic wave in the observation point (u, v) and φHab(u, v,φM1)φ is a minor axis of the elliptically polarized wave. Therefore, an axial ratio AR(u, v) of the elliptically polarized electromagnetic wave is obtained by the following equation.

$$AR(u, v)=|Hah(u, v, \phi MA)|/|Hab(u, v, \phi M1)|$$

When the axial ratio AR(u, v)=1.0, it shows that it is a circularly polarized electromagnetic wave. When the axial ration AR(u, v) is infinite, it shows that it is a linearly polarized electromagnetic wave.

In addition, an inclination θ(u, v) (inclination in the former stage) in the direction where the elliptically polarized electromagnetic wave propagates is obtained as a phase difference between the vertical component Ha(u, v) and the horizontal component Hb(u, v).

In this manner, the axial ratio AR(u, v), a rotating angle (major axis angle) φMA(u, v), intensity (major axis)φH(u, v, φMA)|, and the inclination relative to the propagation direction θ(u, v) are obtained from the polarized wave vectors Hah(u, v, φ) at each observation point (u, v) by the polarization calculation unit 332. These parameters of the polarized wave vectors Hab are displayed on a display unit 333 along with the observation points (u, v). For instance, the display surface of the display unit 333 is assumed to be a two-dimensional plane of u and v.

One of the parameters of the axial ratio AR(u, v), the rotating angle φMA(u, v), and the inclination with respect to the propagation direction θ(u, v) is selected by a switch 334 and is input to a hue converter 335 and is converted to a hue signal corresponding to its magnitude. The color on the display unit 333 is controlled by the output of the hue converter 335, and the brightness of the display unit 333 is controlled by the intensity |H(u, v,φMA)|.

Figure 7:
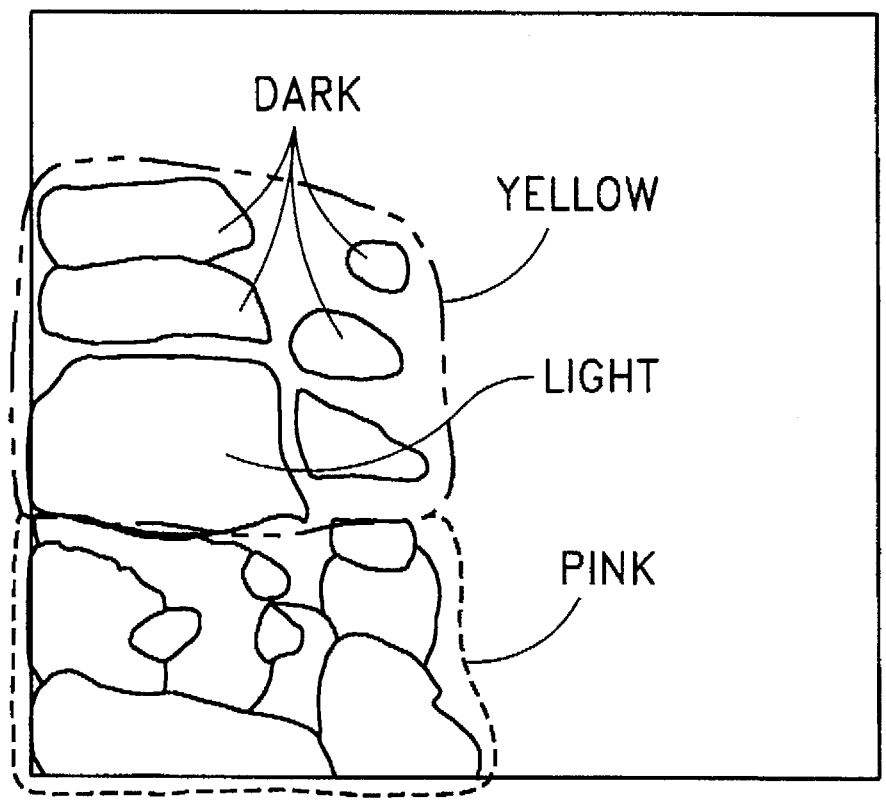
FIG. 7 shows an example of display according to the embodiment of FIG. 6.

For instance, FIG. 7 shows a display example when an unwanted radiation from an electronic equipment was observed by the apparatus of the present invention and the rotating angle φMA is selected by the switch 334. It is understood, in the display example, that there are unwanted radiations from a left part of the electronic equipment and the major axis is in a horizontal direction with a pink color as shown in the lower left of the display. The part which is yellow at the upper part of the pink color is understood to be the major axis and is in the vertical direction. It is also known that, in the yellow part, the lower side is bright and thus the electromagnetic wave intensity is high, while the upper part is faint and thus the intensity is low.

In the foregoing configuration, the switches 314 and 323 may be omitted. In such a case, each output of the antennas 313a and 313b is converted to an IF signal by the frequency converters, and further converted to the discrete Fourier spectrums by the discrete Fourier transform units. Two interferometers 322 may be provided and the outputs of the interferometers 322 are supplied to the interference data memories 324 and 325. The outputs of the interference data memories 324 and 325 are switched, and the read-out data are supplied to a single hologram reconstruction unit. The hologram reconstruction results are switched to the holographic memories 329 and 331.

In the case of observing unwanted radiations from an electronic equipment like the above-mentioned example, when there is only one signal source in the electronic equipment, a fixed antenna 318 which takes out the reference signal from the signal source may be obviated. To obtain the complex signals, two received signals are quadrature-detected and the detected output is separated to real and imaginary parts. In such a case, to obtain each frequency component, the local signal frequency of the quadrature detection should be changed one by one. In addition, the hologram reconstruction calculation for a location which is relatively close to the electromagnetic wave observation plane 311 should be performed according to the equation well known in the art.

The electromagnetic waves are received by the antenna pair with mutually orthogonal 8-figured beam patterns at each observation point of the electromagnetic wave observation plane 311 according to the invention as described above. The two received signals are converted to the complex signals and the complex signals are performed by the hologram reconstruction. The polarization states of electromagnetic wave of the signal source can be known by analyzing the results in assuming that the electromagnetic wave is an elliptically polarized wave having a vertical component and a horizontal component.

(4) The fourth embodiment of the invention is explained with reference to the drawings.

Figure 8:
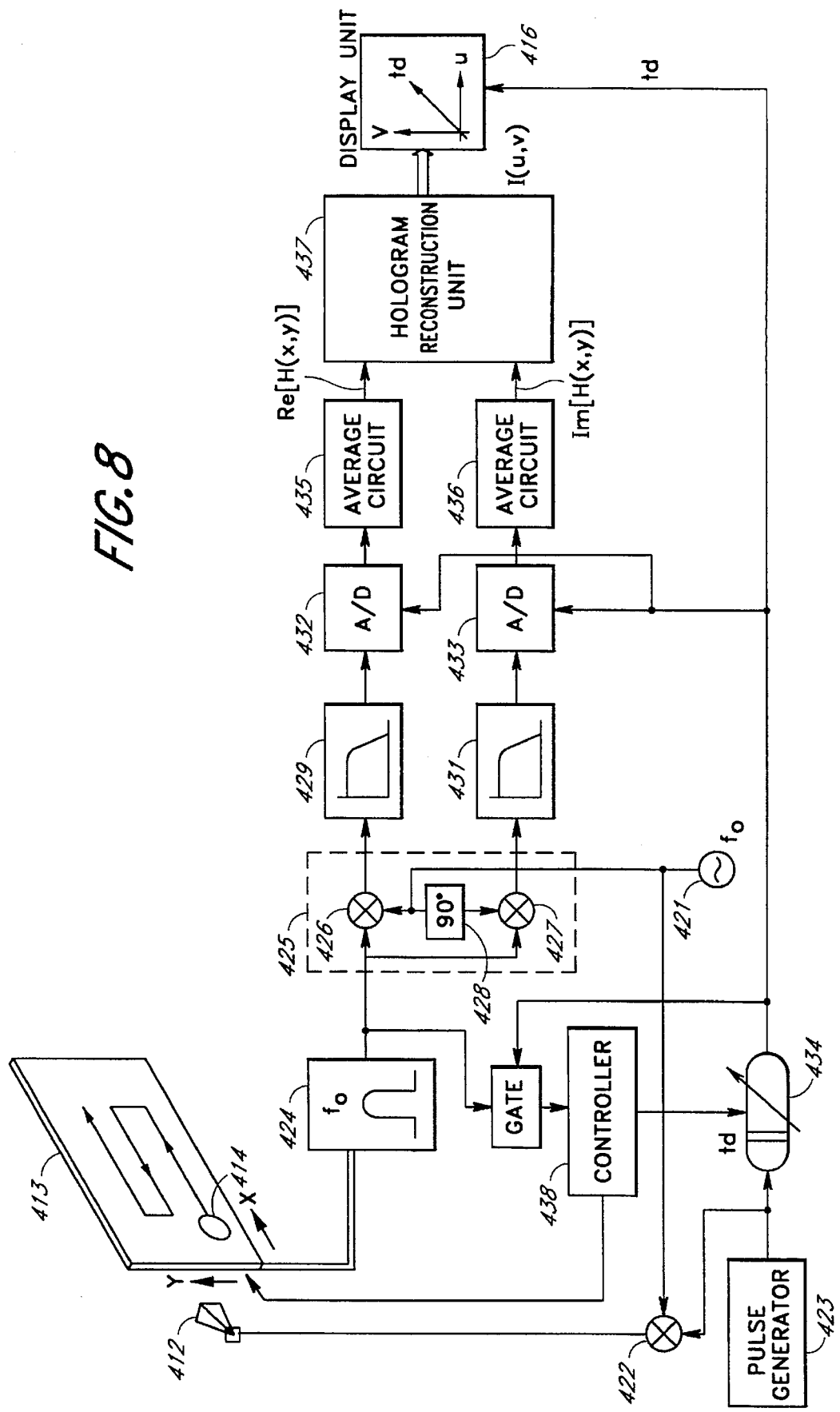
FIG. 8 is a block diagram showing an embodiment of a holographic radar of the invention.
Figure 11:
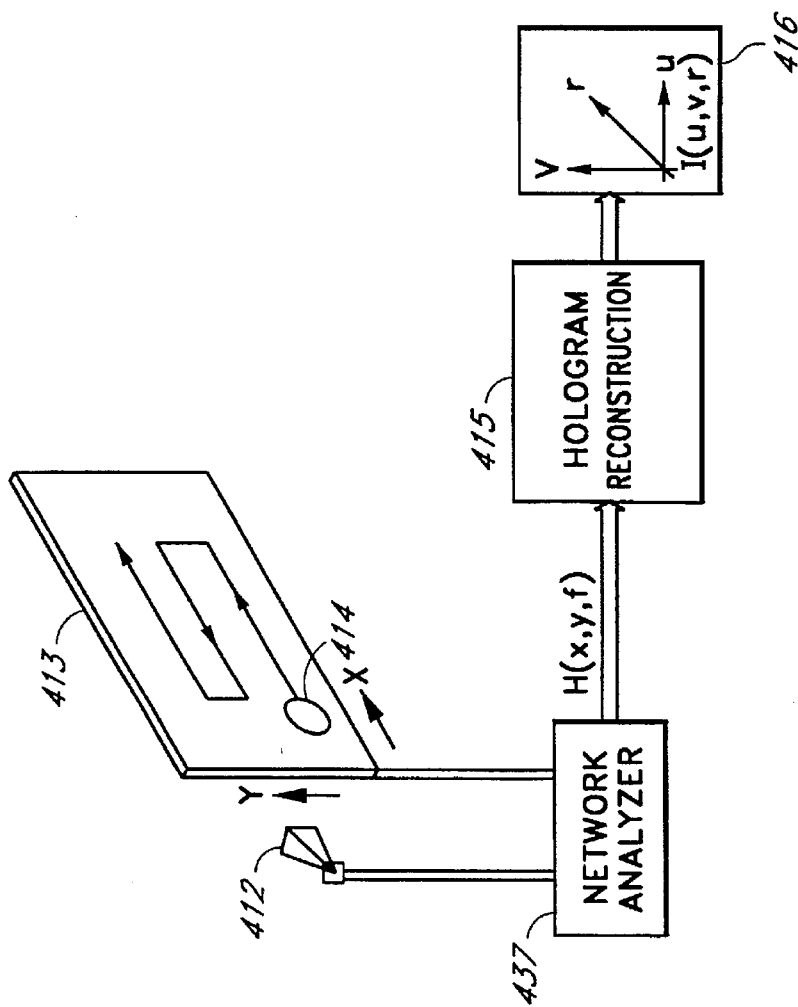
FIG. 11 is a block diagram showing a prior art holographic radar.

An embodiment of holographic radar of the present invention is shown in FIG. 8 and the same reference labels are used for designating the parts which correspond to FIG. 11. A high frequency signal of a sine wave with frequency f0 from an oscillator 421 is modulated by the pulse from a pulse generator 423 in a modulator 422 in this embodiment. The high frequency signal is supplied to an antenna 412 for emitting an electromagnetic wave as a high frequency pulse to be radiated to the observation space. The reflected waves from the observation space are received by a scanning-antenna receiving means in a hologram observation plane 413. An example of such scanning-antenna receiving means is shown in the above noted document "Near-Field Antenna Measurements".

For the received signal from the antennas 412, the high frequency signal f0 is selected by a band pass filter 424 and quadrature detection is carried out for the high frequency signal by a quadrature detection unit 425 with the use of a high frequency signal from an oscillator 421. That is, the output of the filter 424 is supplied to multiplication units 426 and 427 and the high frequency signal from the oscillator 421 is supplied to the multiplication unit 426 and to a phase shifter 428 whereby shifted its phase by $\pi/2$ and is supplied to the multiplication unit 427.

Unnecessary signals are removed by low pass filters 429 and 431 and the outputs of the multiplication units 426 and 427 are supplied to AD conversion units 432 and 433, respectively. In the AD conversion units 432 and 433, the signals from the low pass filters 429 and 431 are sampled in synchronism with the pulse from the pulse generator 423 and each sampled data is converted to a digital signal. This sampled signal is obtained as a signal that is delayed by Td from a pulse generated by a pulse generator 423. The delay time Td is provided to the pulse by a variable delay circuit 434.

If necessary, for each output of the AD conversion units 432 and 433, plural signals for the same receiving point are added and averaged by averaging circuits 435 and 436 to improve a signal noise ration S/N, and is supplied to a 5 hologram reconstruction calculation unit 437. When signals for all receive points (x, y) on the observation plane 413 are received from the averaging circuits 435 and 436 according to the sampling signal of the delay time td with respect to the transmitted high frequency pulse, the hologram reconstruction calculation of the observation plane 413 is carried out for the signals Re[H(x, y)] and Im[H(x, y)] by the next equation, $$I(u, v) = \iint H(x, y) \exp\{(-j2\pi(ux+vy))\} dx dy$$

The delay time td corresponds to a distance r from the observation plane 413, that is., the distance r=c·td/2 (c is the speed of light). Therefore, results I(u, v) of the hologram reconstruction calculation unit 437 and the delay time td or the distance r are displayed by a three-dimensional display unit 416. The reflection body image in each distance r from the observation plane 413 is displayed on the three-dimensional display unit 416 by changing the delay time td, acquiring signals, and operating the hologram reconstruction. An example of three-dimensional display unit 416 is shown in the following document, Peter R. Keller, Mary M. Keller, Visual Cues: Practical Data Visualization, IEEE Press, 1993.

To obtain the received signal in all points (x, y) on the observation plane 413 at each delay time td, it is possible to obtain the received signal by one point (x, y) at the transmission of each high frequency pulse. It is also possible to obtain the received signal for each point (x, y) at each transmission of the high frequency pulse. The receives signal is sampled by the AD conversion units 432 and 433, respectively, by the pulse train which shifted sequentially at fixed time. The received signals of all the delay time of the receiving point (x, y) are obtained, while receiving points (x, y) are moved. A receiving antenna 414 may be an array antenna and switched at high-speed for each transmission of the high frequency pulse to receive the signals. The switching time is adjusted to the minimum change in delay time td, for instance, and when the next high frequency pulse is transmitted, the position of the antenna is shifted by one to obtain signals for each receiving point (x, y) corresponding to each delay time td.

The signals of all the delay times td are not necessarily be obtained from all of the receiving points (x, y). That is, for the delay time td, only one antenna or one point on the observation plane 413 is used, and only when the reflected wave is obtained, signals of all the receiving points (x, y) on the observation plane 413 are received for each delay time td. For doing this, the delay time td of the variable delay circuit 434 is controlled by the control unit 438. The receiving point (x, y) on the observation point 413 is switched by the antenna 414. Further, the output of the band pass filter 424 is provided to the controller 438 through a gate 439 which is opened by an output pulse of the variable delay circuit 434. The controller 438 determines whether only the switching of the delay time td is performed or the switching the receiving point (x, y) to receive signals for all of the receiving points.

Figure 9:
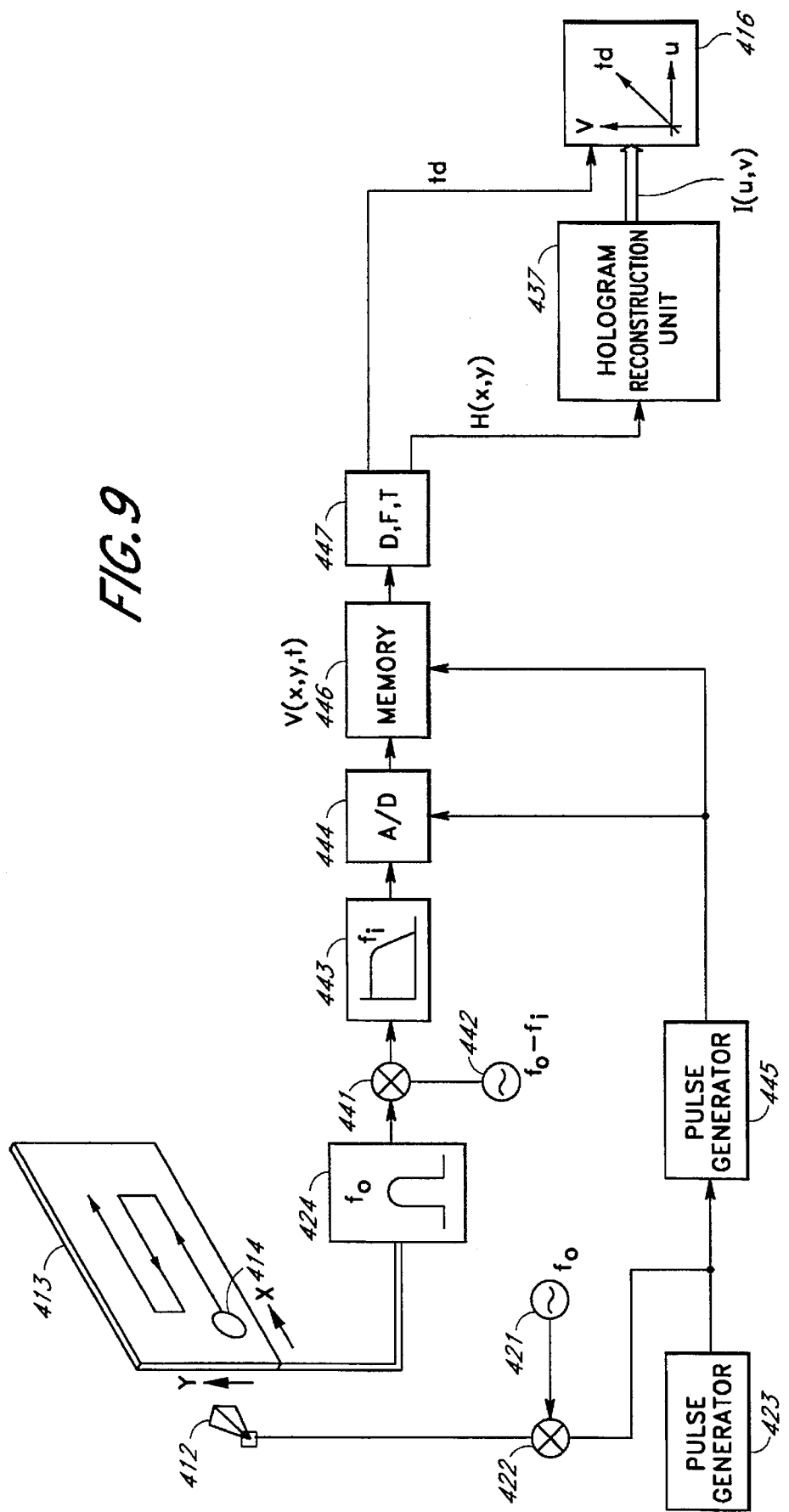
FIG. 9 is a block diagram showing an embodiment of a holographic radar of the invention.

Next, the embodiment of the holographic radar of the present invention is explained with reference to FIG. 9. In FIG. 9, the same reference labels are used for the parts which correspond to FIG. 8. The output of the band pass filter 424 is mixed with the local signal of frequency f0–fi from a local oscillator 442 by a mixer 441. The mixed output is passed through a low pass filter 443. Thus, the signal of frequency f0 from the band pass filter 424 is converted to the signal of frequency fl. For instance, the frequency fi is about 1 MHz while the frequency f0 ranges from 1 MHz to 10 MHz. This signal of low frequency fi is sampled at an AD converter 444 by a sampling pulse train which is synchronized with the pulse from the pulse generator 423 and has a frequency of more than two times of the frequency fi. This sampling pulse train is generated by a pulse generator 445 when receiving the pulse from the pulse generator 423.

The received signals which are converted to the low frequency signals are sampled by the above-mentioned pulse train at each receiving point (x, y) of the observation plane 413 and sampled outputs V(x,y,t) of the digital value are stored in a memory 446. The sampled output V(x,y,t) at each receiving point (x, y) is read, and is shifted by the fixed time td, for calculations of Fourier spectrums by a discrete Fourier transform unit 447 which performs the following discrete Fourier transform function.

$$H(x, y) = \int V(x,y,t) \exp(-j2\pi fi) dt,$$

where the range of integration extends from td to td+42 t.

The delay time Td is the same as the delay time in FIG. 8 and Δt is a time which corresponds to the number of the data used for the discrete Fourier transform of FIG. 8, that is, a product of a sampling period and a number of the data.

The results of the discrete Fourier transform H(x, y) are input to a hologram reconstruction calculation unit 437, wherein the calculation under the equation (2) is performed. The results I(u, v) and corresponding delay time td are supplied to the three-dimensional display unit 416, and are displayed in a three dimensional form.

The actual processing example is explained about the example shown in FIG. 8. The azimuth angle and the elevation angle are assumed to be 90 degree as an angle of visibility within the range of the observation, and the distance is assumed to be 10–1000 m. Measurement resolution is assumed to be 1.5 degree for the azimuth angle, 1.5 degree for the elevation angle, and 3 m for the and distance, respectively. Here, the distance between the adjacent measurement points is assumed as Δx–Δy=1.5 cm. If the number of measurement points is 64×64, an area of the observation plane 413 is 1 m ×1 m. The electromagnetic wave frequency f0 for the emission (oscillation frequency of oscillator 421) is assumed to be f0=10 GHz. The pulse width PW of the pulse from the pulse generator 423 is assumed to be PW=10 nS. The pulse repetition period is assumed to be τ=10 μS. The observation time for all ranges is about 15 second. The scanning time for the observation plane is 50 millisecond if the antenna 414 is an array antenna and scanned electrically at each pulse repetition.

Figure 10:
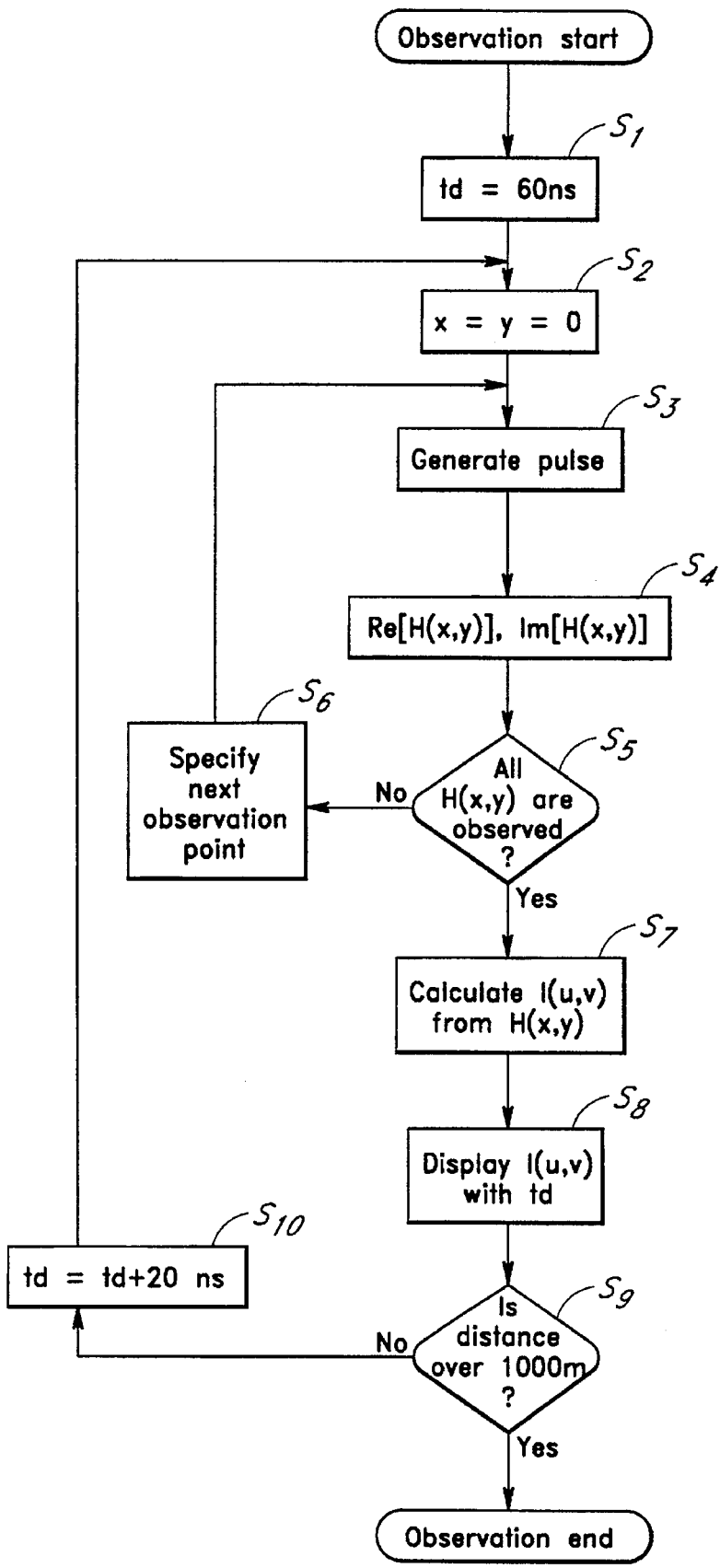
FIG. 10 shows a flowchart of an example of processing means in the embodiment of FIG. 8.

The processing procedure in this situation is shown in FIG. 10. First of all, the delay time td is set to 60 nS in step S1. The measurement point (x, y) on the observation plane 413 is assumed to be x=0 and y=0 in step S2. The pulse is generated by the pulse generator 423 in step S3. Each output of the averaging circuits 435 and 436 is temporarily stored in the hologram reconstruction operation part 437 in step S4. Whether the data H(x, y) for all points (x, y) has been acquired is examined in step S5. If all the data has not been acquired, the process returns to the step S3 for specifying the next measurement point by changing the x or y by Δx or Δy in step S6. When the data H(x, y) of all points (x, y) has been acquired, the hologram reconstruction calculation is carried out in step S7.

The data I(u, v) is displayed on the display unit 416 at the position of td (distance ctd/2) in step S8. Next, whether the distance ctd/2 exceeds 1000 m, that is, whether the delay time td exceeds 6.7 μS, is examined in step S9. If not exceeds, the process returns to the step S2 while adding 20 ns to td in step S10. When td>6.7 μS, the observation procedure ends.

According to the invention as described above, because of obtaining the signal of each distance from the observation plane 413 and performing the hologram reconstruction calculation, the amount of the calculation can be dramatically decreased from the conventional process because the reconstruction calculation is performed through the double integration process without using the triple integration process as shown by the equation (2). Moreover, the information on the distance can be known from the delay time td or the time length (td–td+Δt) of the data sequence for the discrete Fourier transform.

(5) The fifth embodiment of the invention is explained with reference to the drawings.

Figure 12:
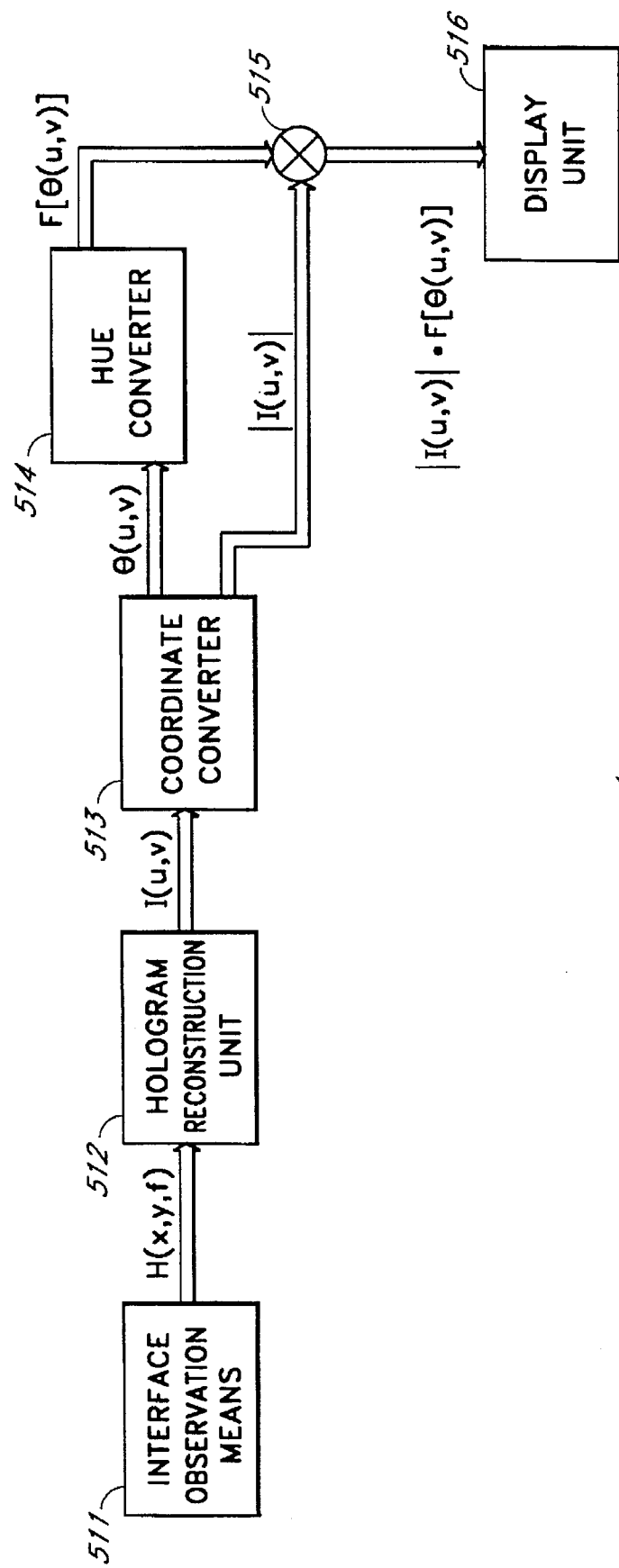
FIG. 12 is a block diagram showing an embodiment of a complex wave interference information display apparatus of the invention.

The embodiment of the display apparatus of the complex wave interference information of the invention is shown in FIG. 12. Two-dimensional interference data H(x, y) of electromagnetic waves in a three-dimensional space is obtained from an interference data observation means 511. Here, (x, y) shows an orthogonal coordinate position on the observation plane. An actual composition of the interference data observation means 511 is given later. The hologram reconstruction calculation is performed by using the two-dimensional interference data H(x, y) by a hologram construction calculation unit 512. As the hologram reconstruction calculation, Fraunhofer transform is used which is shown in the next equation.

$$I(u, v) = \iint H(x, y) \exp((-j2\pi(ux+vy))dxdy$$

where u, v show an azimuth angle and an elevation angle, respectively, when seeing from the point (x, y) on the observation plane.

For instance, at the observation point (x, y) on the observation plane apart from the electromagnetic wave source by a distance Z, the two-dimensional interference data H(x, y) is observed which includes a transfer function of $\exp\{(j\pi/(\lambda Z(u^2+v^2))\}$. In addition, Fourier integration of the observation plane is convolved into the transfer function.

For the result I(u,v) of the hologram reconstruction calculation, conversion from the orthogonal coordinate to the polar coordinate is performed by a coordinate converter 513. That is, the result I(u,v) is calculated as a real part and an imaginary part. The amplitude and the phase of I(u, v) which corresponds to the real part and imaginary part are calculated. Phase information θ(u, v) of the coordinate converted data is further converted to a color signal F [θ(u, v)] of the corresponding hue by a hue converter 514. This color signal F [θ(u, v)] is multiplied by the amplitude information |I(u, v)| of the coordinate-converted data from the coordinate converter 513 by a multiplication unit 515 and are modulated as a result. The modulated output |(u, v)|·F[θ(u, v)] is displayed on a color display unit 516 as a color image on a u-v plane.

The amplitude information |I(u, v)| of I(u, v) is large and intense at a position closer (Z: small) to the observation plane (electromagnetic wave source) but quickly becomes small in the circumference area, and phase information θ(u,v) changes comparatively slowly from the center to the surrounding. On the other hand, the amplitude information on I(u,v) is small and weak at a position far (Z: large) from the observation plane (electromagnetic wave source) and gradually becomes smaller from the center to the surrounding. The phase information changes relatively quickly from the center to the surrounding.

Figure 13:
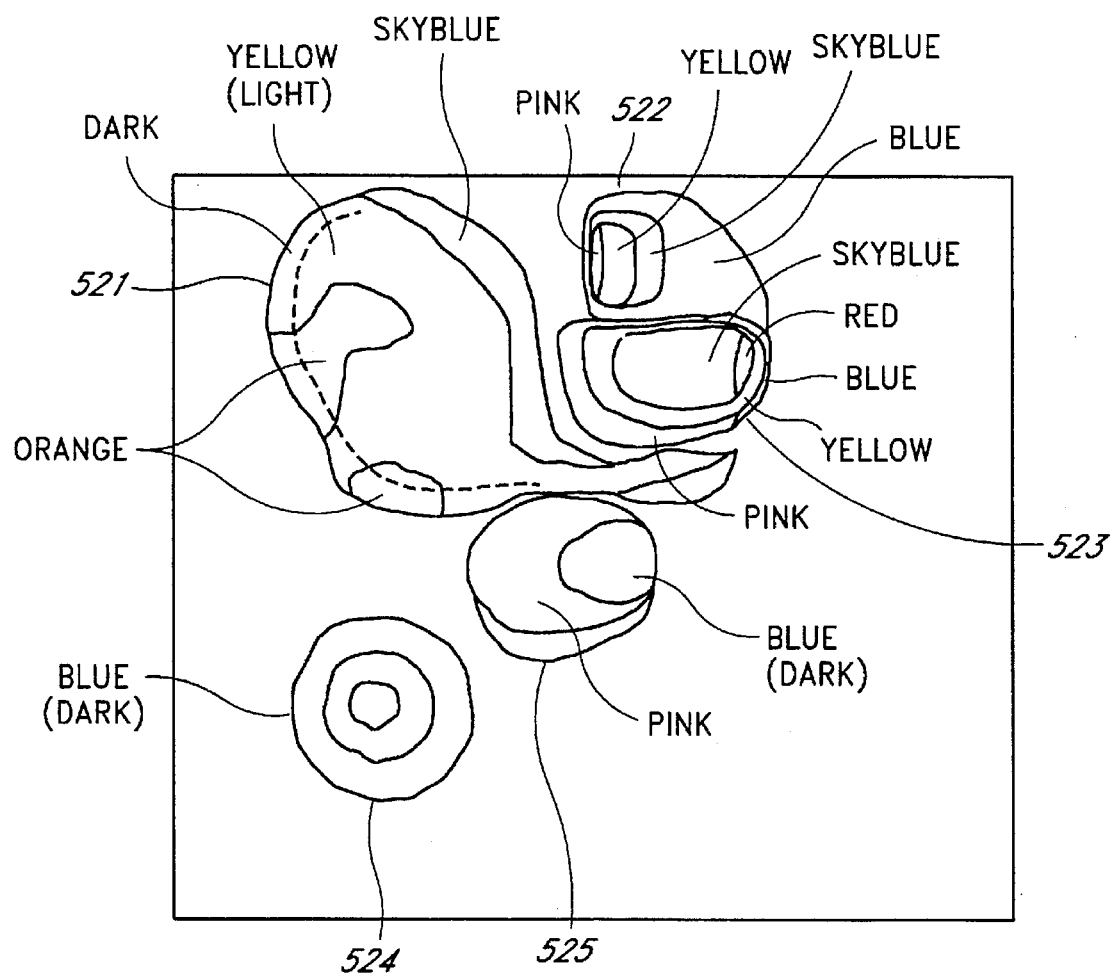
FIG. 13 shows a displayed example of the display unit according to the embodiment of FIG. 12.

FIG. 13 is an example shown on the display unit 516 when receiving an unwanted radiation from an electronic equipment by the observation plane of the observation apparatus of the present invention, and obtaining the complex two-dimensional electromagnetic wave interference data, and processing the data as shown in FIG. 12. The large image 521 in the upper left part is large and bright while rapidly decreasing the brightness in the periphery of the image 521. The phase is gradually changed from the center of the image 521 to the surrounding as exemplified by color stripes which are rough (thick). Therefore, it is understood that the image 521 is close to the observation plane. Moreover, color stripes look bigger in the right side than the left side and thus an electromagnetic wave of this unwanted radiation is judged to be radiated in the left direction.

As for an image 522 in the upper right of the image 521, it is smaller than the image 521, brightness is also lower, and the color stripe is detailed. That is, the phase changes rapidly from the center to the surrounding and the stripes in the right side are rougher than that of the left side. That is, it is understood that the radiation source of the image 522 is farther than the image 521 and is radiated in the right direction.

An image 523 under the lower right of the image 521, that is, under the image 522, is slightly larger and brighter than the image 522 and the thickness of the color stripe is about the same level. Therefore, the radiation source of the image 521 is located closer to the observation plane than the image 522 and the intensity is slightly higher than the image 522. The color stripe is rougher in the left side than the right side and thus it is understood that the direction of radiation is from the right to the left.

An image 524 which is apart from the image 521 is light, dark, and relatively small. The color stripe is slightly thicker than that of the images 522 and 523. Therefore, it is judged that the radiation source is weak in the intensity and closer to the observation plane than the images 522 and 523, and radiates in the direction perpendicular to this paper.

In a similar manner, an image 525 located between the image 521 and the image 524 is judged to be a weak radiation source located relatively close to the observation plane and radiates in the left direction.

Figure 14:
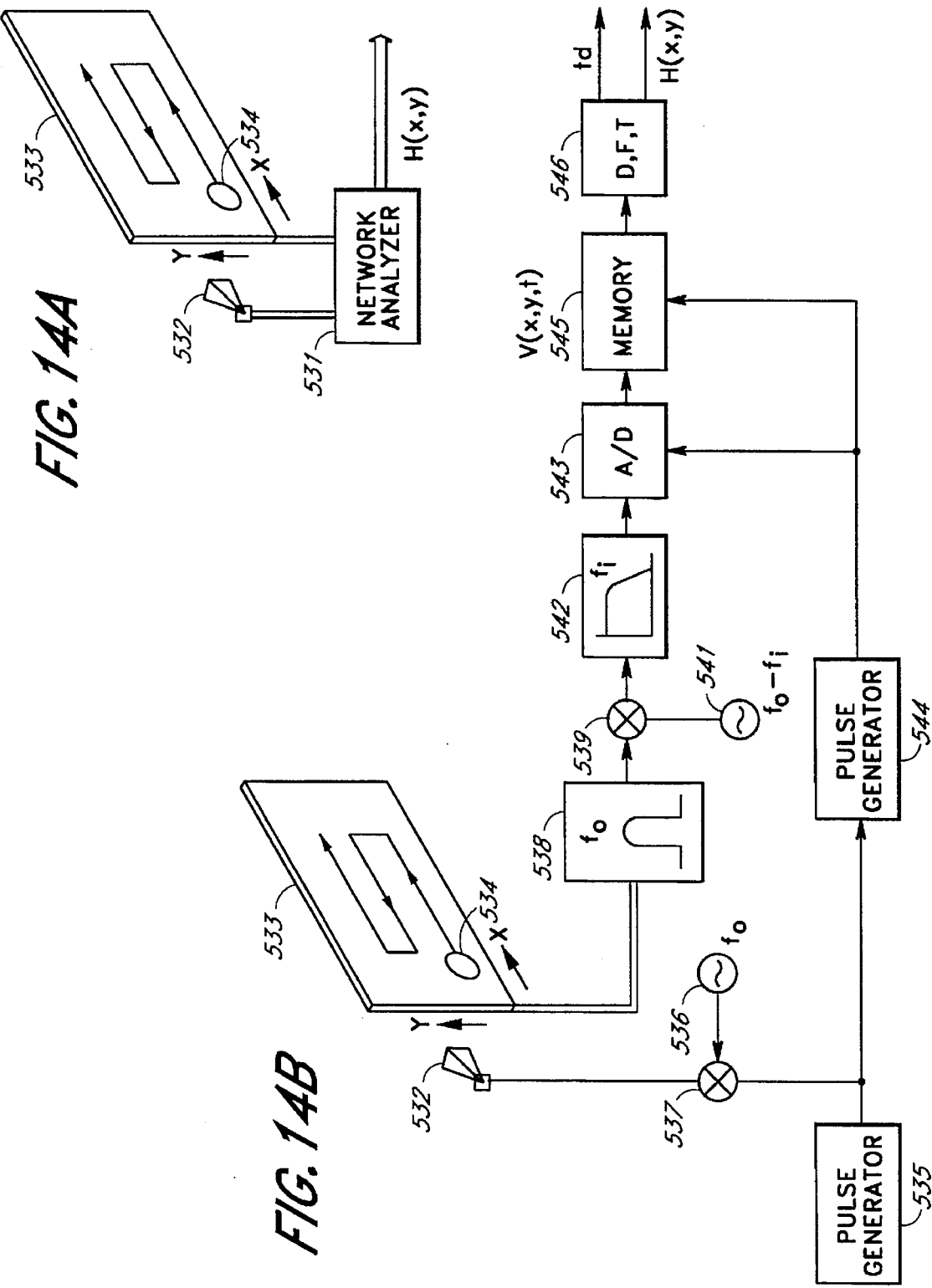
FIG. 14 is a block diagram showing two-dimensional interference data observation means as a part of the holographic radar.

Next, a specific example of the two-dimensional interference data observation means 511 is shown. A high frequency signal such as a microwave and millimeter wave is supplied to an antenna 532 for the electromagnetic wave emission by a network analyzer 531 as shown in FIG. 14A which is a case of a holographic radar. A high frequency electromagnetic wave is radiated continuously from the antenna 532 toward the observation space. The reflected waves (usually interference waves of the reflected waves from two or more places) are received by a receive antenna 534 at each observation point (x, y) on a hologram observation plane 533 facing the observation space and the received signal is input to the network analyzer 531. The transfer function of the route of an electromagnetic wave, that is, the two-dimensional interference data H(x, y, f) from the antenna 532 for the electromagnetic wave emission to the receiving point (x, y) is obtained.

The receive antenna 534 can be moved to each observation point (x, y) on the observation plane 533 to receive reflected waves at each observation point (x, y). Alternatively, these antennas can be switched one by one by arranging the receive antenna 534 at each observation point (x, y) on the observation plane 533 and the received signal at each observation point (x, y) is taken into the network analyzer 531. That is, the reflected wave at each observation point (x, y) on the observation plane 533 is received by the scanning-antenna receiving means. A frequency f of an electromagnetic wave of the radiated high frequency is slightly changed step by step and the space transfer function, that is, two-dimensional interference data H(x, y, f) of each of the frequencies f is measured as mentioned above.

In addition, another example is shown in FIG. 14B in which the same reference labels are used to designate the parts which correspond to FIG. 14A. A micro wave signal of frequency f0 from an oscillator 536 is modulated by a modulator 537 by a pulse from a pulse generator 535 and the high frequency pulse is radiated from the antenna 532. The received signal from the antenna 534 is supplied to a filter 538 wherein the frequency f0 is a pass band frequency. The output of the filter 538 is mixed with the local signal of frequency f0–fi from local oscillator 541 by a mixer 539. The output of the mixer 539 passes through a low pass filter 542.

Thus, the received signal of frequency f0 from the band pass filter 538 is converted to the signal of frequency fi. For instance, the frequency f0 is about 1 GHz–10 GHz and the frequency fi is 1 MHz. The frequency converted signal having the low frequency fi is sampled by an AD conversion unit 543 in synchronism with the pulse signal from the pulse generator 535 which has a frequency greater than two times of the frequency fi. The sampled data is also converted to a digital signal by the AD conversion unit 543. The above noted sampling pulse is formed by a pulse train generator 544 when it received the pulse from the pulse generator 535.

As noted above, the low frequency received signal is sampled by the above-mentioned pulse train at each receiving point (x, y) of the observation plane 533 and the sampled output V(x, y, t) of the digital value is stored in a memory 545. The stored data in the memory 545 is read out at every fixed time td. The calculation based on the following equation is performed by a discrete Fourier transform 546 wherein the discrete Fourier transform is performed for the sampled data V(x,y,t) at each receiving point (x, y).

$$H(x, y) = \int V(x,y,t) \exp(-j2\pi fi) dt.$$

where the range of integration extends from td to td+Δt.

The results of the discrete Fourier transform obtained by this process shows two-dimensional interference data H(x, y) and the time td corresponds to a distance Z from the observation plane 533.

Figure 15:
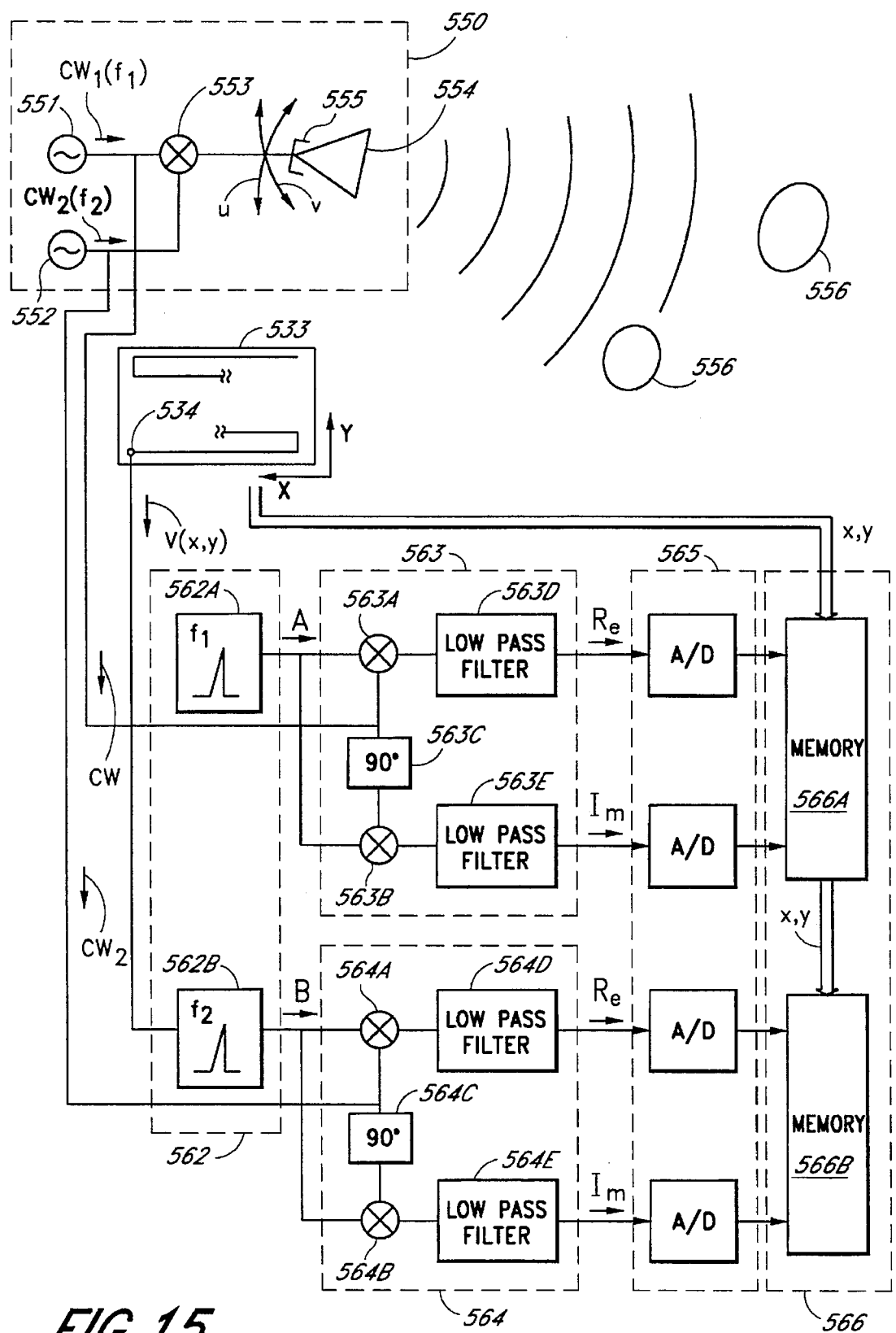
FIG. 15 is a block diagram showing another example of a two-dimensional interference data observation means.

Another specific example of observation of the two-dimensional interference data is shown in FIG. 15. A signal generator 550 is provided to generate a continuous wave with two frequencies which are close with each other. The signal generator 550 is formed of signal sources 551 and 552, a radiation transducer 554 of a single directivity and a drive means 555 for displacing the radiation transducer 554 in a radiation direction of an elevation angle V and an azimuth angle U. The direction in which the transducer 554 aims at for the radiation of a single direction in the azimuth angle U and the elevation angle V so that an observation object 556 is exposed to a beam of electromagnetic wave. For instance, frequencies f1 and f2 of the signal output from the signal source 551 and 552 are selected to be f1=15.003 GHz and f2=15,009 GHz, respectively.

The transducer 534 for receiving the electromagnetic wave is composed of an antenna which receives the electromagnetic wave which is reflected by the observation object 556. The transducer 534 moves in the directions of x and y for scanning on the plane 533 (hereafter, called a hologram observation plane) facing the observation object 556. Whenever the radiation transducer 554 displaces the direction of the emission of the electromagnetic wave, the transducer 534 for receiving the reflected wave executes one scanning operation. The hologram data is taken evenly from the whole area of observation object 556 by repeating this process by 2–4 times.

A received hologram signal V(x, y) from the receiving transducer 534 is separated to a signal A of the frequency f1 and a signal B of the frequency f2 by a frequency selection means 562. In this example, the frequency selection means 562 is formed of band pass filters 562A and 562B. The signals A and B separated by the frequency selection means 562 are input to first Fourier integration means 563 and 564, respectively. The first Fourier integral means 563 and 564 may be composed of mixer-pairs 563A-563B and 564A-564B, low-pass filter pairs 563D-563E and 564E-564E, and phase shifters 563C and 564C which are used to shift the phase of reference signals CW1 and CW2 by 90 degrees and input to the mixers 563B and 564B, respectively.

Each of the mixers 563A, 563B, 564A, and 564B outputs signals having frequencies of the sum and difference between the two signals. In this example, the difference frequency is taken out through low-pass filters 563D, 563E, and 564D, 564E. That is, zero beat signals are taken out through the low-pass filters 563D, 563E, and 564D, 564E. A real number part Re of the quadrature components of the hologram data at each observation point (x, y) is obtained from the mixers 563A and 564A which are directly provided with the reference signals CW1 and CW2, respectively. Moreover, an imaginary part Im of the quadrature components of the hologram data at each observation point (x, y) is obtained from the mixers 563B and 564B which are provided with the reference signals CW1 and CW2 whose phases are 90 degrees shifted.

The real number part Re and the imaginary number part Im are AD converted by an AD conversion unit 565 having a group of AD converters. The output of the AD conversion unit 565 is provided to a second Fourier integration means 566. The second Fourier integration means 566 may be formed Of two memories 566A of 566B. Each set of the real number part Re and the imaginary number part Im is stored, for example, in the same addresses of the memories 566A and 566B.

Namely, a scanning position signal (x, y) from the receiving transducer 534 is provided to the second Fourier integration means 566. The scanning position signal (x, y) is used as an address signal to store the quadrature components (the real number part Re and the imaginary number part Im) in the memories 566A and 566B for each observation point (x, y). By storing the quadrature components (the real number part Re and the imaginary number part Im) concerning each observation point (x, y), the Fourier integration is performed and thus, two-dimensional interference data H(x,y, f1) and H(x,y, f2) are obtained. The hologram construction calculation is performed for the two-dimensional interference data by the hologram construction calculation unit 12 according to the following equation.

$$I(u, v, f1) = \iint H(x, y, f1) \exp\{-j2\pi(ux+vy)\} dx dy.$$

$$I(u, v, f2) = \iint H(x, y, f2) \exp\{-j2\pi(ux+vy)\} dx dy.$$

The sum $|I(u, v)|$ of the amplitude information of the results of these reproduction calculation and the difference $\theta(u, v)$ of the phase information are obtained by the following equation.

$$|I(u, v)| = |I(u, v, f1)| + |I(u, v, f2)|$$

$$\theta(u, v) = \theta(u, v, f1) - \theta(u, v, f2).$$

The above noted data corresponds to the output of the coordinate converter 513 of FIG. 12, and the former data is provided to the multiplication unit 515 while the latter data is provided to the hue converter 514.

Figure 16:
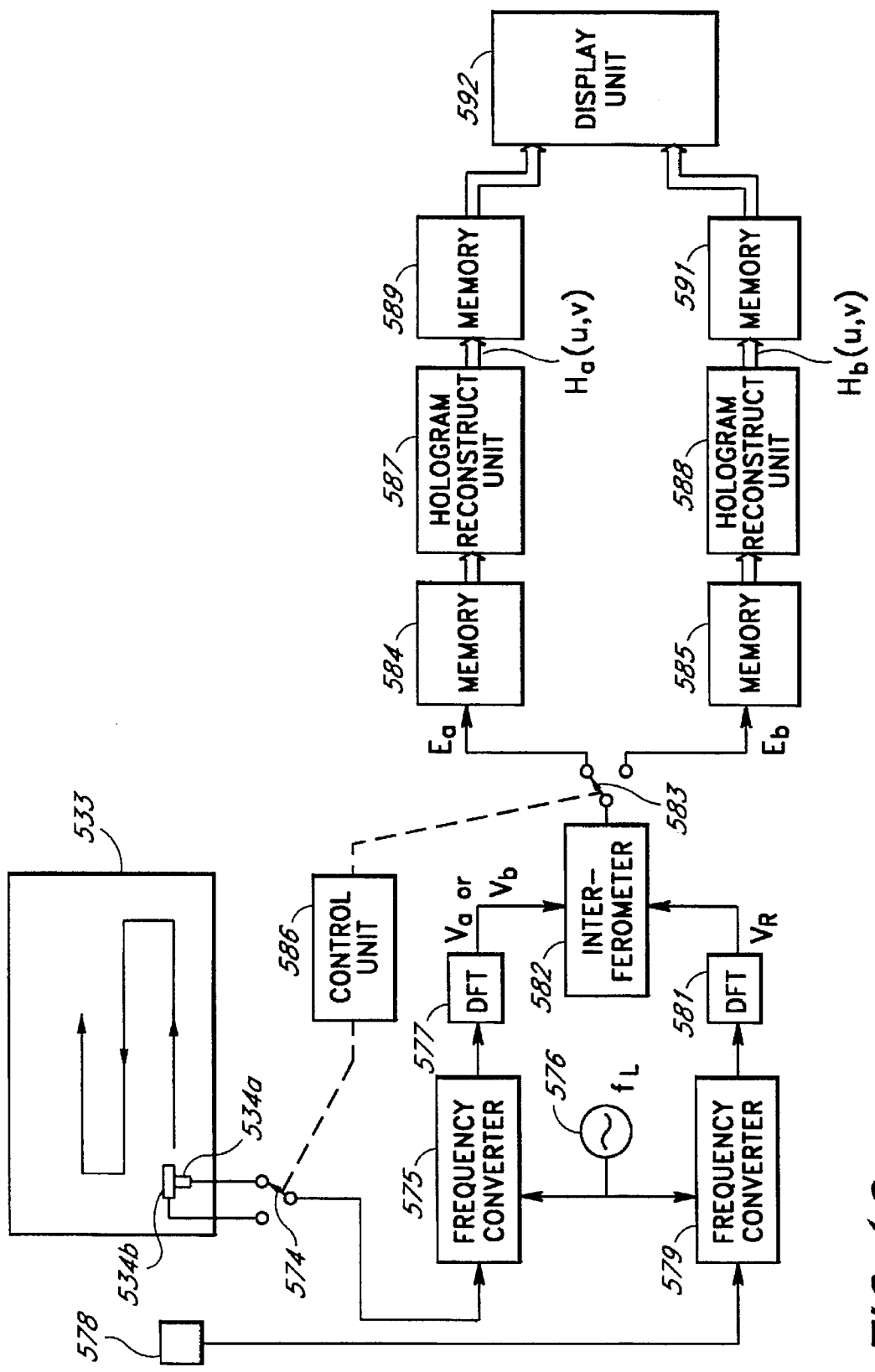
FIG. 16 is a block diagram showing further example of a two-dimensional interference data observation means.

Further, an example of observing electromagnetic waves which generally propagate in the space or an unwanted radiation from an electronic equipment as observation of the two-dimensional interference data is explained with reference to FIG. 16. An antenna-element pair 534a and 534b with mutually orthogonal 8-figured beam patterns receives electromagnetic waves at each observation point (x, y) of the observation plane 533 in a manner similar to the previous example. The received signal of the antennas 534a and 534b is switched by a switch 574 and is supplied to a frequency converter 575. In the frequency converter 575, the received signal is converted to an intermediate frequency (IF) signal by a local signal from a local oscillator 576 whose frequency is fL. A Fourier conversion process is performed for the IF signal by a discrete Fourier transform unit 577. As a result, complex signals Va(x, y) and Vb(x, y) which corresponded to the output of the antenna 534a and 534b at each observation point (x, y) of the observation plane 533 are obtained.

On the other hand, a received signal from a fixed antenna 578 is used as a reference phase for the received signal from the antennas 534a and 534b. In the similar process, the reference signal is converted to complex signals. That is, the output of fixed antenna 578 is converted to the IF signal by the local signal from the local oscillator 576 in a frequency converter 579, the discrete Fourier transform is performed by a discrete Fourier transform unit 581 for the IF signal from the frequency converter 579, and a reference complex signal VR of the reference signal is obtained as a result.

The complex signals Va(x, y) and Vb(x, y) for each observation point are divided by the reference complex signal VR by an interferometer 582, resulting two-dimensional interference data Ha(x, y) and Hb(x, y), respectively. The interference data Ha(x, y) and Hb(x, y) are switched by a switch 583 and are stored in interference data memories 584 and 585, respectively. In that case, the information which shows the observation point (x, y) is provided from a control unit 586 to the memories 584 and 585 as address data and stored therein. Moreover, the control unit 586 controls the switching operation of switches 574 and 583.

The hologram reconstruction calculation is carried out for the interference data Ha(x, y) and Hb(x, y) with respect to the observation plane 533 by hologram construction calculation units 587 and 588 based on the following equations.

$$Ia(u, v) = \iint Ha(x, y) \exp\{-j2\pi(ux+vy)\} dx dy.$$

$$Ia(u, v) = \iint Hb(x, y) \exp\{-j2\pi(ux+vy)\} dx dy.$$

In this example, an axial ratio of the polarization can also be measured. The results Ia(u, v) and Ib(u, v) of the hologram reconstruction calculation are stored in holographic memories 589 and 591, respectively. A polarized wave vector Iab(u, v, φ) of an elliptically polarized wave having each of the results Ia(u, v) and Ib(u, v) of hologram reconstruction as a vertical component and a horizontal component, respectively is obtained by a polarization calculation unit 592 according to the following equation about each observation point (u, v).

$$Iab(u, v, \phi) = Ia(u, v) \cos \phi + Ib(u, v) \sin \phi.$$

That is, the polarized wave vector Iab has only a vertical component Ia(u, v) when φ=0, and has only a horizontal component Ib(u, v) when φ=π/2.

An angle φMA by which the absolute value of the polarized wave vector Iab becomes maximum and an angle φM1 by which the absolute value becomes minimum are obtained about each observation point (u, v). In this situation, |Iab(u, v, φMA)| designates a major axis of the elliptically polarized wave in the observation point (u, v) and |Iab(u, v, φMI)| designates a minor axis of the elliptically polarized wave. Therefore, an axial ratio AR(u, v) of the elliptically polarized wave is obtained by the following equation.

$$AR(u, v) = |Iab(u, v, \phi MA)|/|Iab(u, v, \phi MI)|.$$

When the axial ratio is AR(u, v)=1.0, the equation designates a circularly polarized wave. When the axial ratio AR(u, v) is infinite, the equation designates a linearly polarized wave.

In addition, an inclination θ(u, v) (inclination of former stages) in the direction of the propagation of the elliptically polarized electromagnetic wave is obtained as a difference between the phase of vertical component Ia(u, v) and the phase of horizontal component Ib(u, v). The angle φMA by which the absolute value of polarized wave vector Iab becomes the maximum value is given by the following equations.

$$\phi MA(u, v) = (\tfrac{1}{2})\tan^{-1}(2|Ia(u, v)||Ib(u, v)|\cos(\theta(u, v))/(|Ia(u, v)|^2 - |Ib(u, v)|^2)).$$

Because this information is on the phase, it is input to a hue converter 514 directly. Because the axial ratio AR(u, v) is not the phase information, an angle of elliptical aperture $\tau(u, v)$ which corresponds to a phase is defined as follows, $$\tau(u, v) = (\tfrac{1}{2})\sin^{-1}(2|Ia(u, v)||Ib(u, v)|\sin(\theta(u, v))/(|Ia(u, v)|^2 + |Ib(u, v)|^2)).$$

Either of the inclination $\theta(u, v)$ to the direction, the axial ratio AR(u, v) or the rotating angle $\phi MA(u, v)$ (major axis angle) can be selected and supplied to the hue converter 514 in FIG. 12, and the intensity (major axis) data |Iab(U, v, $\phi MA$)| may be supplied to the multiplication unit 515. In such a case, the coordinate conversion from the orthogonal coordinate to the polar coordinate should be performed in advance.

As in the foregoing, the phase information in the complex two-dimensional wave interference data is converted to color signal and the color signal is modulated by the amplitude information. Thus, it is able to illustrate the distance in a direction perpendicular to the display surface and the phase information in a color illustration. That is, states of the complex three-dimensional space can be displayed by the two-dimensional computer graphics.

What is claimed is:

1. A non-contact type transfer function measurement apparatus which provides an input signal to an input terminal of a distributed constant network under observation, comprising:

scanning-antenna receiving means for receiving electromagnetic waves radiated from said network at a number of observation points on an electromagnetic wave observation plane facing said network;

transfer function measuring means for measuring transfer functions between said input terminal of said network and said observation points;

transfer function conversion means for converting said transfer functions between said input terminal and said observation points of said network at each observation frequency of said input signal using an inverse-Fresnel transform process or Fourier transform process;

display means for displaying said converted transfer functions as frequency responses in said network.

2. A non-contact type transfer function measurement apparatus according to claim 1, wherein said display means displays a physical shape of said network, said display means including means for displaying said converted transfer function at said observation frequency in a two dimensional form and means for displaying frequency characteristics of location specified in said two dimensional form as a frequency response.

3. A non-contact type transfer function measurement apparatus according to claim 2, wherein said display means displays said physical shape and said converted transfer function in an overlay fashion.

4. A non-contact type transfer function measurement apparatus according to claim 1 further comprises characteristic compensating means for compensating a frequency characteristic of said transfer function measuring means.

5. A non-contact type transfer function measurement apparatus according to claim 1 further comprises domain converting means for converting frequency responses to time-domain responses using the inverse-Fourier transform, and wherein said display means displays said time-domain responses.

6. A non-contact type transfer function measurement apparatus according to claim 1 wherein said scanning-antenna receiving means is composed of an array antenna on said observation plane, and received signals of said array antenna are output by scanning said array antenna.

7. A non-contact type transfer function measurement apparatus according to claim 1 wherein said scanning-antenna receiving means is composed of an antenna which is moved to specified positions on said observation plane, and received signals of said antenna are output at said specified positions.

8. A non-contact type signal observation apparatus which observes signals at a number of observation points on an electromagnetic wave observation plane which faces a distributed constant network under observation, comprising:

scanning-antenna receiving means for receiving a repetition signal from said network;

means for generating a pulse signal synchronized with said repetition signal;

complex voltage converting means for converting said received signal to complex voltages based on the phase of said pulse signal at each observation frequency of said received signal;

means for converting said complex voltages to image data using an inverse-Fresnel transform process or a Fourier transform process;

display means for displaying said image data as spectra or waveforms.

9. A non-contact type signal observation apparatus according to claim 8, further comprises characteristic compensating means for compensating a frequency characteristic of said image data using data of radiation frequency characteristics of radiation points of said network and a frequency characteristic of said observation apparatus.

10. A non-contact type signal observation apparatus according to claim 8 wherein said complex voltage converting means is composed of means for filtering a frequency component of said observation frequency from both said received signal and said pulse signal, means for converting both filtered signals to low frequency signals, and means for converting transformed results of said received signal to signals which are referred to the phase of transformed results of said pulse signal.

11. A non-contact type signal observation apparatus according to claim 8 wherein said complex voltage converting means is composed of means for converting said received signal to low frequency signals by using a local signal generated by a local oscillator and a quadrature local signal which is produced by said local signal and is phase-shifted by 90 degree, means for converting said low frequency signal using the complex Fourier transform, means for converting said pulse signal to low frequency signals, means for converting both of said low frequency signals using the discrete Fourier transform, and means for performing an interference operation for transformed results of said received signal with respect to transformed results of said pulse signals.

12. A non-contact signal observation apparatus according to claim 11 wherein said repetition signal receiving means is composed of a reference timing antenna which receives electromagnetic waves from said network.

13. A non-contact type signal observation apparatus according to claim 8 wherein said scanning-antenna receiving means is composed of an antenna which is moved to specified positions on said observation plane, and received signals of said antenna are output at said specified positions.

14. A non-contact type signal observation apparatus according to claim 8 wherein said scanning-antenna receiving means is composed of an array antenna on said observation plane, and received signals of said array antenna are output by scanning said array antenna.

15. A non-contact signal observation apparatus according to claim 14, wherein said repetition signal receiving means is composed of a specific antenna element of said array antenna.

16. A spatial electromagnetic wave analysis apparatus which receives spatial electromagnetic waves at a number of observation points of an electromagnetic wave observation plane, and analyzes states of electromagnetic waves in a space, comprising:

scanning-antenna receiving means for receiving electromagnetic waves at said observation points by an antenna-element pair with mutually orthogonal 8-figured beam patterns;

complex signal converting means for converting received signals of said antenna-element pair to complex signals respectively;

reference signal receiving means for receiving a reference signal in said electromagnetic waves which is used as a reference phase for said received signals;

means for converting said reference signal to a reference complex signal;

means for calculating interference data of orthogonal polarized wave components of said received signals by dividing said complex signal by said reference complex signal;

means for calculating holograms using hologram reconstruction calculations of said interference data over said observation plane;

means for calculating polarized wave vectors which include results of said hologram calculations in vertical and horizontal components of elliptically polarized waves, at said observation points in said space;

display means for displaying parameters of said polarized wave vectors at said observation points.

17. A spatial electromagnetic wave analysis apparatus according to claim 16 wherein said reference receiving means is a fixed antenna.

18. A spatial electromagnetic wave analysis apparatus according to claim 16 wherein said complex signal converting means is composed of means for converting a frequency of said received signal to an IF signal of an intermediate frequency and means for converting said IF signal to Fourier spectrum using discrete Fourier transform process.

19. A spatial electromagnetic wave analysis apparatus according to claim 16 wherein said display means displays brightness modulated images according to intensity of said polarized wave vectors and hue modulated images according to other parameters of said polarized wave vectors at said reconstructed analysis points.

20. A spatial electromagnetic wave analysis apparatus according to claim 16 wherein said scanning-antenna receiving means is composed of an array antenna of said antenna-element pair on said observation plane, and received signals of said array antenna are output by scanning said array antenna.

21. A spatial electromagnetic wave analysis apparatus according to claim 16 wherein said scanning-antenna receiving means is composed of a scanning antenna of said antenna-element pair which is moved to specified positions on said observation plane, and received signals of said scanning antenna are output at said specified positions.

22. A holographic radar comprising:

means for radiating electromagnetic waves generated from a high frequency signal modulated by a pulse signal toward an object in a space;

scanning-antenna receiving means for receiving reflected waves from said object at a number of observation points on a hologram observation plane and for outputting received signals;

means for quadrature-detecting said received signals using said high frequency signal;

means for sampling said quadrature-detected signals by a sampling pulse signal synchronized with said pulse signal;

means for performing hologram reconstruction calculations on said sampled signal with respect to each of said observation points of said hologram observation plane;

variable delay means for delaying said sampling pulse signal by a delay value before supplying to said sampling means;

display means for displaying results of said hologram reconstruction calculations relative to said delay value in a three dimension form.

23. A holographic radar according to claim 22 wherein said scanning-antenna receiving means is composed of a scanning antenna which is moved to specified positions on said observation plane, and received signals of said scanning antenna are output at said specified positions.

24. A holographic radar according to claim 22 which further comprises means for judging whether said received signals are available at the advent of said sampling pulse signal from said variable delay means, and means for obtaining said received signals at all of said observation points only when said judging means determines that said received signals are available in synchronism with said sampling pulse signal.

25. A holographic radar according to claim 22 wherein said scanning-antenna receiving means is composed of an array antenna on said observation plane, and received signals of said array antenna are output by scanning said array antenna.

26. A holographic radar comprising:

means for radiating electromagnetic waves generated from a high frequency signal modulated by a pulse signal toward an object in a space;

scanning-antenna receiving means for receiving reflected waves from said object at a number of observation points on a hologram observation plane and for outputting received signals;

means for converting said received signals to low frequency signals;

means for sampling said low frequency signals in synchronism with said pulse signal by a sampling pulse signal having a frequency more than two times higher than that of said low frequency signals;

means for converting a fixed number of data produced by said sampling means which are delayed by a specified delay value through a discrete Fourier transform process;

means for performing hologram reconstruction calculations on results of said discrete Fourier transform process with respect to each of said observation points on said hologram observation plane;

display means for displaying results of said hologram reconstruction calculations relative to said delay value in a three dimension form.

27. A complex wave interference information display apparatus comprising:
- interference data observing means for observing complex two-dimensional wave interference data;
- means for performing hologram reconstruction calculations of said interference data;
- means for converting coordinates of results of said hologram reconstruction calculations from orthogonal to polar coordinates;
- means for converting phase information in polar coordinates data obtained by said converting means to hue information;
- means for modulating said hue information by amplitude information in said polar coordinates data;
- display means for displaying said modulated data as a two-dimensional color image.

28. A complex wave interference information display apparatus according to claim 27 further includes a holographic radar wherein said interference data observing means receives waves on an observation plane of said holographic radar and converts received signals to complex signals.

29. A complex wave interference information display apparatus according to claim 28 wherein said interference data observing means for receiving said two-dimensional interference waves in a three-dimensional space at a number of observation points on said observation plane and converts received signals to complex signals.

30. A complex wave interference information display apparatus according to claim 29 wherein said two-dimensional interference waves at said observation points are received by an antenna-element pair with mutually orthogonal 8-figured beam patterns, and wherein holograms are acquired from said complex two-dimensional interference data received from said antenna-element pair, and wherein polarized wave vectors are acquired which have said holograms as vertical and horizontal components, and wherein either of an axial ratio, a rotating angle or an inclination at the direction of propagation of the polarized wave vectors is used as said phase information.

* * * * *